(12) United States Patent
Narendrnath et al.

(10) Patent No.: US 10,131,126 B2
(45) Date of Patent: Nov. 20, 2018

(54) METHODS FOR BONDING SUBSTRATES

(71) Applicant: Applied Materials, Inc., Santa Clara, CA (US)

(72) Inventors: Kadthala Ramaya Narendrnath, San Jose, CA (US); Gangadhar Sheelavant, Karnataka (IN); Monika Agarwal, Fremont, CA (US); Ashish Bhatnagar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 111 days.

(21) Appl. No.: 15/453,456

(22) Filed: Mar. 8, 2017

(65) Prior Publication Data

US 2017/0173934 A1 Jun. 22, 2017

Related U.S. Application Data

(62) Division of application No. 14/015,650, filed on Aug. 30, 2013, now Pat. No. 9,627,231.

(Continued)

(51) Int. Cl.
*B32B 7/12* (2006.01)
*B32B 7/14* (2006.01)
(Continued)

(52) U.S. Cl.
CPC .......... *B32B 37/1292* (2013.01); *B32B 7/14* (2013.01); *H01L 21/67005* (2013.01);
(Continued)

(58) Field of Classification Search
USPC ................ 156/94, 247, 249, 701, 703, 704
See application file for complete search history.

(56) References Cited

U.S. PATENT DOCUMENTS 3,765,431 A * 10/1973 Jannett .................. H01L 21/67
134/113
5,465,515 A 11/1995 Walieddine
(Continued)

FOREIGN PATENT DOCUMENTS

CN 1602545 A 3/2005
JP 2002059363 A 2/2002
(Continued)

OTHER PUBLICATIONS

Office Action for Japanese Patent Application No. 2015-533075 dated Jun. 5, 2017.
(Continued)

*Primary Examiner* — Sing P Chan
(74) *Attorney, Agent, or Firm* — Patterson + Sheridan, LLP

(57) ABSTRACT

Methods for fabricating and refurbishing an assembly are disclosed herein. The method begins by applying an adhesive layer onto a first substrate. A second substrate is placed onto the adhesive layer, thereby securing the two substrates together, the adhesive layer bounding at least one side of a channel that extends laterally between the substrates to an exterior of the assembly. And, the substrates and the adhesive layer are subjected to a bonding procedure and allowing outgassing of volatiles from the adhesive layer to escape from between the substrates through the channel, wherein the substrates bonded by the adhesive layer form a component for a semiconductor vacuum processing chamber.

18 Claims, 16 Drawing Sheets

Related U.S. Application Data

(60) Provisional application No. 61/703,220, filed on Sep. 19, 2012.

(51) Int. Cl.
    *H01L 21/67*     (2006.01)
    *H01L 21/683*     (2006.01)
    *H01L 21/687*     (2006.01)
    *B32B 37/12*     (2006.01)

(52) U.S. Cl.
CPC .... *H01L 21/67092* (2013.01); *H01L 21/6831* (2013.01); *H01L 21/6833* (2013.01); *H01L 21/6835* (2013.01); *H01L 21/68785* (2013.01); H01L 21/67109 (2013.01); H01L 2221/68318 (2013.01); H01L 2221/68381 (2013.01); H01L 2224/2732 (2013.01); H01L 2224/27318 (2013.01); H01L 2224/27436 (2013.01); H01L 2224/27438 (2013.01); H01L 2224/29011 (2013.01); H01L 2224/29012 (2013.01); H01L 2224/29013 (2013.01); H01L 2224/29014 (2013.01); H01L 2224/2919 (2013.01); H01L 2224/29078 (2013.01); H01L 2224/29191 (2013.01); H01L 2224/83862 (2013.01); H01L 2224/83877 (2013.01); H01L 2224/98 (2013.01); H01L 2924/15151 (2013.01); Y10T 156/10 (2015.01); Y10T 279/23 (2015.01); Y10T 428/24851 (2015.01)

(56) References Cited

U.S. PATENT DOCUMENTS

| | | | |
|---|---|---|---|
| 6,630,218 B1* | 10/2003 | Abe | C09J 7/38 |
| | | | 428/40.1 |
| 6,639,783 B1 | 10/2003 | Shamouilian et al. | |
| 9,627,231 B2* | 4/2017 | Narendrnath | H01L 21/67092 |
| 2003/0178124 A1 | 9/2003 | Mikami et al. | |
| 2006/0013302 A1 | 1/2006 | Bao et al. | |
| 2006/0267504 A1* | 11/2006 | VanDrie | G21B 1/052 |
| | | | 315/111.41 |
| 2007/0072526 A1 | 3/2007 | Ladjias | |
| 2007/0125751 A1* | 6/2007 | Nakamura | H01L 21/67092 |
| | | | 216/83 |
| 2007/0128832 A1* | 6/2007 | Nakamura | B24B 37/30 |
| | | | 438/459 |
| 2007/0292650 A1* | 12/2007 | Suzuki | C09J 7/38 |
| | | | 428/41.8 |
| 2008/0193741 A1 | 8/2008 | Fujii et al. | |
| 2009/0002913 A1 | 1/2009 | Naim | |
| 2009/0025233 A1 | 1/2009 | Kaiser et al. | |
| 2009/0229766 A1* | 9/2009 | Aveldson | B32B 43/006 |
| | | | 156/759 |
| 2010/0039747 A1 | 2/2010 | Sansoni et al. | |
| 2012/0154974 A1 | 6/2012 | Bhatnagar et al. | |
| 2012/0217606 A1* | 8/2012 | Itonaga | H01L 31/0203 |
| | | | 257/443 |
| 2014/0099485 A1* | 4/2014 | Narendrnath | H01L 21/67092 |
| | | | 428/201 |
| 2014/0116615 A1* | 5/2014 | Ogawa | C09J 143/04 |
| | | | 156/275.5 |
| 2014/0366954 A1* | 12/2014 | Miller | B65D 90/00 |
| | | | 137/15.11 |
| 2015/0004726 A1* | 1/2015 | Konishi | H01L 33/501 |
| | | | 438/27 |
| 2015/0028082 A1* | 1/2015 | Miller | B23K 20/1295 |
| | | | 228/112.1 |
| 2015/0028083 A1* | 1/2015 | Miller | B23K 20/14 |
| | | | 228/112.1 |
| 2015/0083320 A1* | 3/2015 | Putnam | B01L 3/502707 |
| | | | 156/285 |
| 2015/0110688 A1* | 4/2015 | Igata | B01L 3/502707 |
| | | | 422/502 |
| 2015/0284595 A1* | 10/2015 | Yoo | C09J 7/20 |
| | | | 428/167 |
| 2016/0372606 A1* | 12/2016 | Ito | H01L 29/78693 |
| 2017/0120400 A1* | 5/2017 | Miller | F16L 55/168 |
| 2017/0173934 A1* | 6/2017 | Narendrnath | H01L 21/67092 |

FOREIGN PATENT DOCUMENTS

| | | |
|---|---|---|
| JP | 2005116948 A | 4/2005 |
| JP | 2006140455 A | 6/2006 |
| JP | 2008/263241 A | 10/2008 |
| TW | 200616139 A | 5/2006 |
| TW | 201101416 A | 1/2011 |
| TW | I612609 B | 1/2018 |
| WO | 2008114520 A1 | 9/2008 |

OTHER PUBLICATIONS

Office Action for Taiwan Patent Application No. 106140096 dated Jun. 29, 2018.
PCT international search report and written opinion of PCT/US2013/056256 dated Nov. 27, 2013.
Office Action from Chinese Patent Application No. 201380048727.0 dated Apr. 12, 2017.
Office Action from Taiwanese Patent Application No. 102130620 dated Mar. 27, 2017.

* cited by examiner

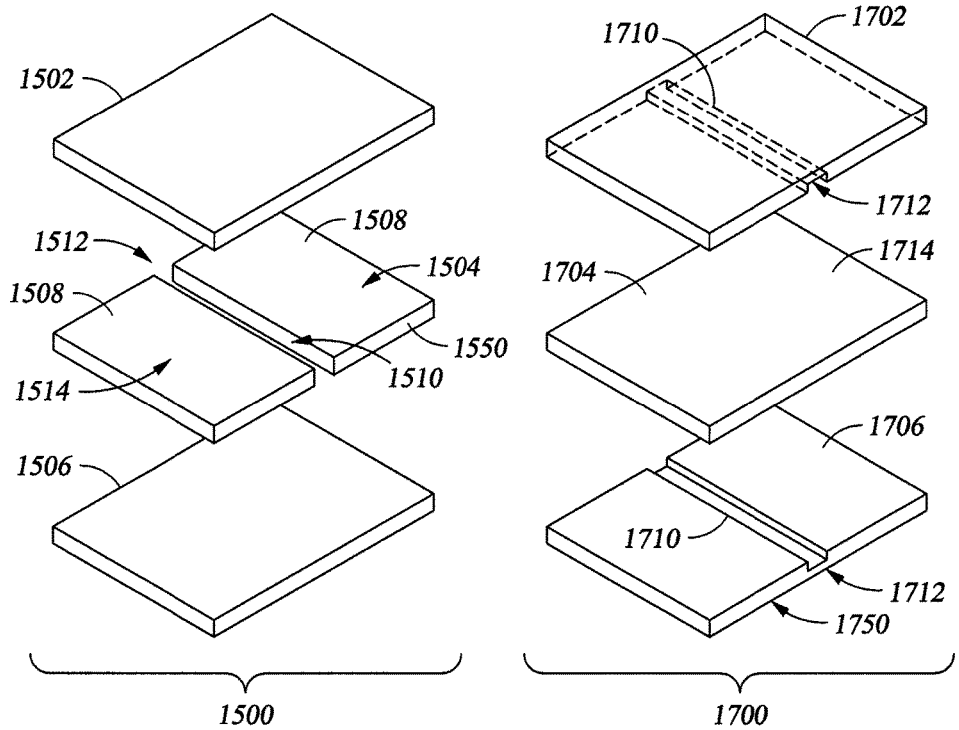
Fig. 15
Fig. 17
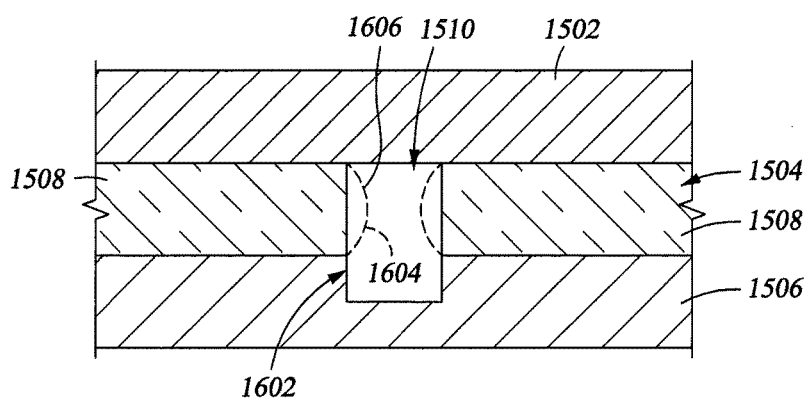
Fig. 16

METHODS FOR BONDING SUBSTRATES

CROSS-REFERENCE TO RELATED APPLICATIONS

This application is a division of U.S. patent application Ser. No. 14/015,650, filed Aug. 30, 2013, which claims benefit of U.S. Provisional Application Ser. No. 61/703,220, filed Sep. 19, 2012, and, both of which are incorporated by reference in their entireties.

BACKGROUND OF THE INVENTION

Field of the Invention

Embodiments of the present invention generally relate to a method for bonding substrates and components suitable for use in a semiconductor processing chamber fabricated by the same, using a segmented bond design.

Description of the Related Art

In substrate processing applications, many chamber parts and components are fabricated using two or more parts, or substrates, bonded together. Examples of such components includes electrostatic pucks bonded to temperature control supports, showerheads bonded to gas distribution plates, and heaters bonded to chamber lids, among others.

FIG. 1 is an example of a conventional chamber part comprising substrates bonded together illustrated as an electrostatic chuck assembly 100. The electrostatic chuck assembly 100 includes an electrostatic puck 102 coupled to a temperature control base 106 by an adhesive layer 104. The electrostatic puck 102 includes a substrate support surface 120 on which a wafer (not shown) is electrostatically retained during vacuum processing. The substrate support surface 120 generally includes a plurality of backside gas delivery holes (not shown) to provide a backside gas, such as helium, to improve heat transfer between the substrate and the electrostatic puck 102.

The adhesive layer 104 is generally a continuous monolithic layer that covers the entire mating surfaces of the electrostatic puck 102 and the temperature control base 106. The adhesive layer 104 may include a number of holes formed therethrough, for example, for accommodating lift pins, RF power delivery rod, helium passages and the like. Only exemplary lift pin holes 110 formed in the adhesive layer 104 are illustrated in FIG. 1 for simplicity. The lift pin holes 110 align with lift pin holes 116 formed through the electrostatic puck 102 and lift pin holes 118 formed through the temperature control base 106.

Referring to the partial sectional view of the electrostatic chuck assembly 100 depicted in FIG. 2, the electrostatic puck 102 generally includes a chucking electrode 202 embedded in a dielectric body 204. The dielectric body 204 is typically fabricated from ceramic materials, such as aluminum nitride and/or oxide. The chucking electrode 202 may be a metal mesh or other suitable conductor. Chucking of a substrate (i.e., wafer) placed on the substrate support surface 120 is achieved through Coulombic or Johnsen-Rahbeck effect by applying a DC voltage to the chucking electrode 202 through the RF power delivery rod (not shown) passing through the temperature control base 106 and adhesive layer 104.

The temperature control base 106 generally includes a thermally conductive body 216, typically fabricated from aluminum, stainless steel or other material with good thermal conductivity. At least one temperature control feature 218 may be formed in and/or coupled to the thermally conductive body 216. The temperature control feature 218 may be a heater or chiller, and in the embodiment illustrated in FIG. 2, the temperature control feature 218 is shown as inner and outer channels 220, 222 through which separately controlled heat transfer fluid may be circulated to provide separate temperature control zones across the substrate support surface 120 of the electrostatic puck 102.

During fabrication and/or use of the electrostatic chuck assembly 100, volatiles out-gassed by the adhesive layer 104, particularly during curing, may become trapped between the electrostatic puck 102 and the temperature control base 106. The trapped volatile gases may delaminate the adhesive layer 104 from one or both of the electrostatic puck 102 and the temperature control base 106, such as shown by a void 210 illustrated in FIG. 2. The void 210 increases thermal impedance between the electrostatic puck 102 and the temperature control base 106 which can result in out-of-spec temperature uniformity on the substrate (e.g., wafer) processed, which in turn leads to costly loss of yield and productivity. Further, in applications which utilize moisture-cured silicones as the adhesive layer 104, fully curing the adhesive layer 104 requires adequate presence and availability of moisture locally at the bond site. Adequate moisture availability becomes difficult or impossible when the adhesive layer is very thin relative to the diameter of the adhesive layer resulting in incomplete curing of the adhesive. This further aggravates the likelihood of volatile outgassing during use and subsequent delamination and/or deteriorating performance of the electrostatic chuck assembly 100.

As the electrostatic chuck assembly 100 must be periodically refurbished, the high aspect ratio of the adhesive layer 104 makes it difficult to thoroughly expose the interior portions of the adhesive layer 104 to solvents needed to efficiently weaken the bond between the electrostatic puck 102 and the temperature control base 106. If the adhesive layer 104 cannot be sufficiently weakened, the electrostatic puck 102 and/or the temperature control base 106 may become damaged if the electrostatic puck 102 and the temperature control base 106 are forcefully pried apart. In extreme instances, the temperature control base 106 may need to be machined away to free the electrostatic puck 102. Thus, refurbishment of conventional electrostatic chuck assemblies 100 may be labor intensive, have high scrap rates and be undesirably expensive.

The above mentioned problems are not unique to electrostatic chuck assemblies, but present to some extent in just about all semiconductor chamber components which utilize a contiguous layer of adhesive to bond two substrates. This problem also exists in display and solar vacuum processing applications as well where the bonding surface areas can be much larger.

Therefore, a need exists for improved methods for bonding substrates, components fabricated by the same, along with improved methods for refurbishing said components.

SUMMARY OF THE INVENTION

In one embodiment, a method for fabricating an assembly is disclosed herein. The method begins by applying an adhesive layer onto a first substrate. A second substrate is placed onto the adhesive layer, thereby securing the two substrates together, the adhesive layer bounding at least one side of a channel that extends laterally between the substrates to an exterior of the assembly. And, the substrates and the adhesive layer are subjected to a bonding procedure and allowing outgassing of volatiles from the adhesive layer to escape from between the substrates through the channel, wherein the substrates bonded by the adhesive layer form a component for a semiconductor vacuum processing chamber.

In another embodiment, a method of refurbishing an assembly having two substrates joined together by an adhesive layer, wherein at least one side of the adhesive layer bounds a channel that laterally extends between the substrates to an exterior of the assembly is disclosed herein. The method begins by introducing a bond weakening agent to an interior region of the adhesive layer through the channel. The substrates are separated. The first substrate is refurbished and a refurbished assembly is formed using the refurbished first substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 15 is an exploded top perspective view of one embodiment of an assembly comprising at least two substrates secured by an adhesive layer having at least one channel formed therein.

FIG. 16 is a partial sectional view of an optional configuration of the channel of FIG. 15.

FIG. 17 is an exploded top perspective view of another embodiment of an assembly comprising at least two substrates having at least one channel suitable for venting an adhesive layer securing the two substrates.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the invention generally provide a method for bonding substrates, assemblies fabricated by the same, along with improved methods for refurbishing said assemblies. Embodiments of the invention described herein take advantage of at least one channel partially bounded by an adhesive utilized to join two substrates. In certain embodiments of the invention, the channel is defined between adjacent segments of an adhesive layer bonding the substrates together. The channel is open to an exterior of the substrate assembly, thus providing a vent path for volatile gases outgassed from the adhesive layer to escape from between the substrates, either during curing or use of the assembly. Advantageously, the vent path enhances better curing of the adhesive layer. The vent path also prevents gas pockets from forming between the substrates which could adversely affect the temperature profile across the surface of the substrates. By improving reliability of the ability to control the temperature profile across the surface of the substrates, out-of-spec temperature uniformity on the wafer, hot spots, etc., which may lead to costly loss of yield and productivity of processed wafers are avoided.

Certain embodiments of the invention include bonding two substrates, such as an electrostatic puck to a temperature control base, with an adhesive layer that is segmented into a plurality of segments, as opposed to a conventional, continuous monolithic adhesive layer. A channel formed between adjacent segments, permits the substrates to be easily debonded for refurbishment and/or service. Furthermore, the channel between adjacent segments additionally permits outgassing of volatiles from between the two substrates, because the channel extends to an exterior of the bonded substrates.

A first embodiment of the invention will illustratively be described as an electrostatic chuck assembly having two substrates joined by an adhesive layer, and having at least one channel that provides a path for volatiles outgassing from the adhesive layer to escape to an exterior of the assembly. A second embodiment of the invention will illustratively be described as a showerhead assembly, while a third embodiment of the invention will generally describe an assembly of at least two substrates. Other embodiments of the invention described herein include methods of fabricating and refurbishing the above referenced assemblies. Still other embodiments of the invention do not necessarily require a channel that provides a path for volatiles, but rather include a methodology for ensuring sufficient adhesion between the substrates so that flatness of the surface upon which the wafer rests remains within a defined flatness tolerance.

Figure 1:
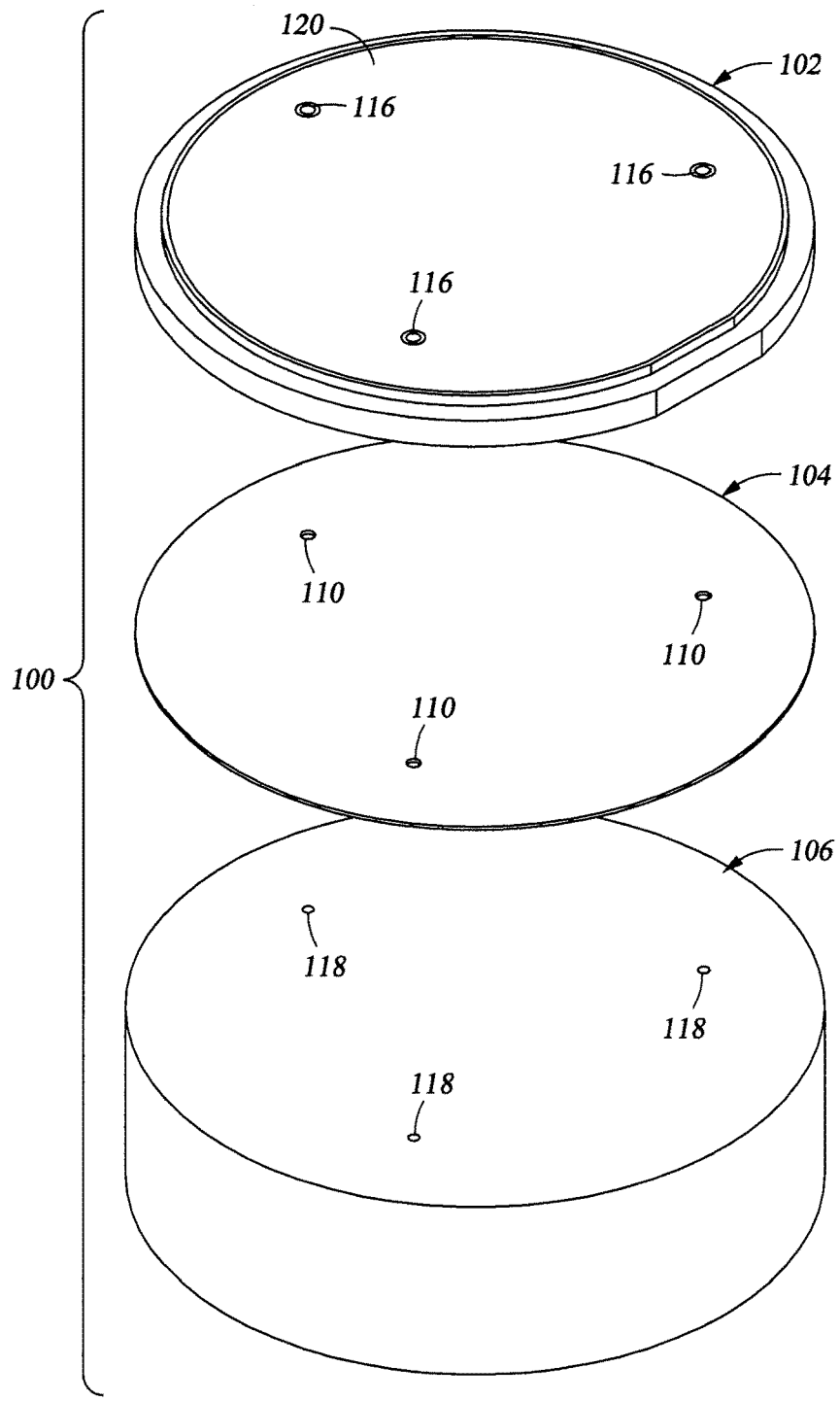
FIG. 1 is an exploded, top perspective view of a conventional electrostatic chuck assembly.
Figure 2:
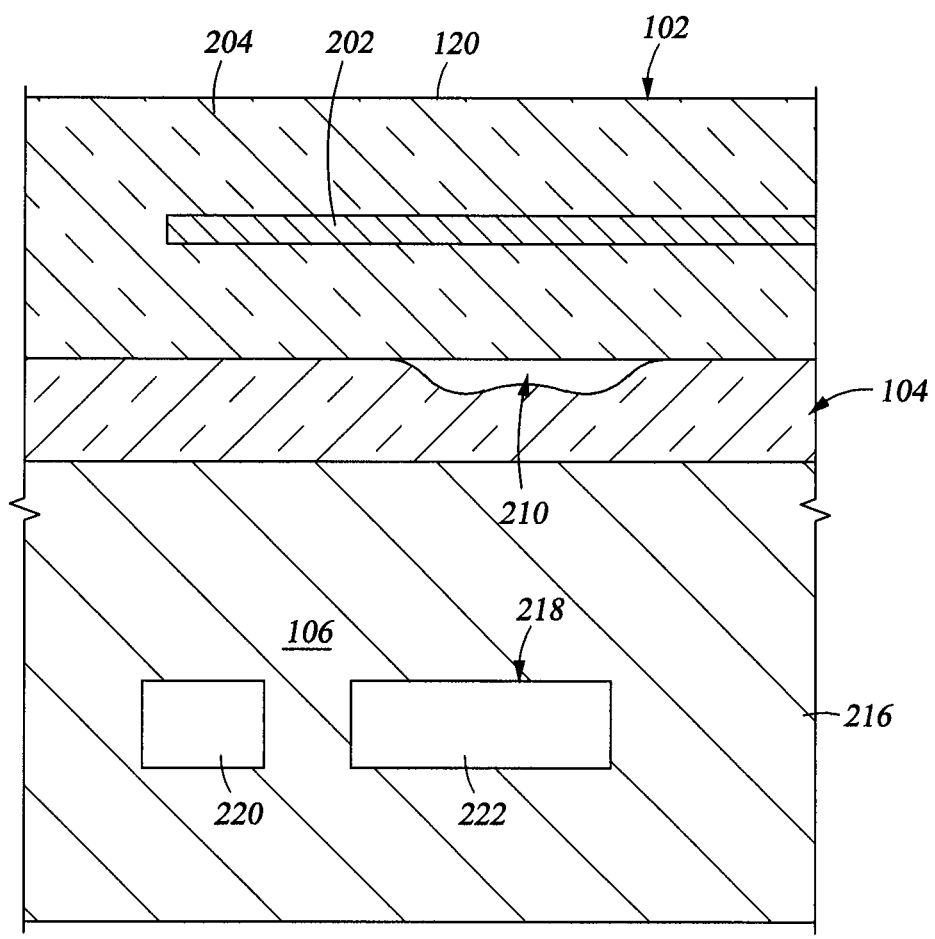
FIG. 2 is a partial cross-sectional view of the electrostatic chuck assembly of FIG. 1.
Figure 3:
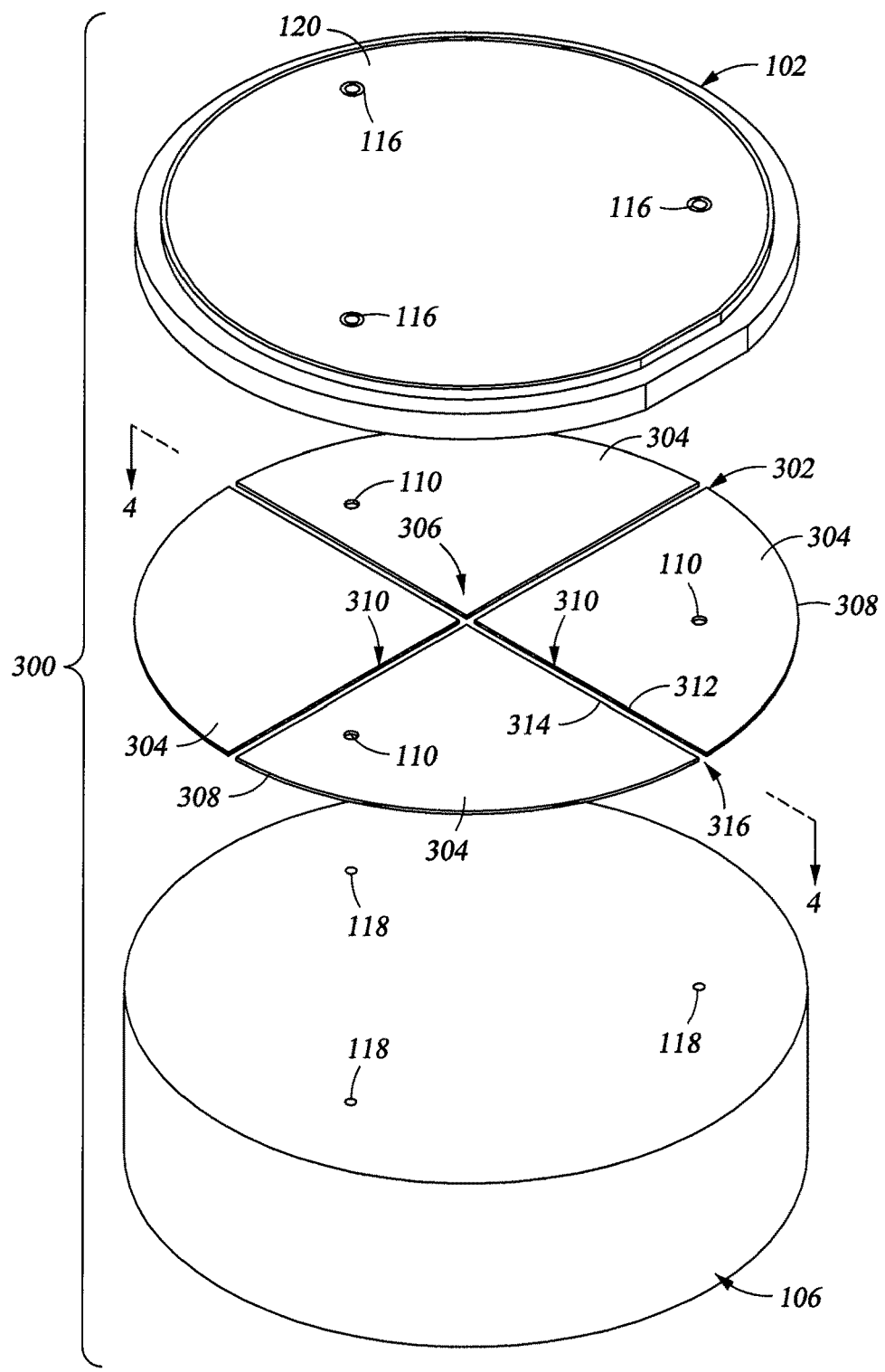
FIG. 3 is an exploded, top perspective view of one embodiment of an electrostatic chuck assembly.
Figure 3A:
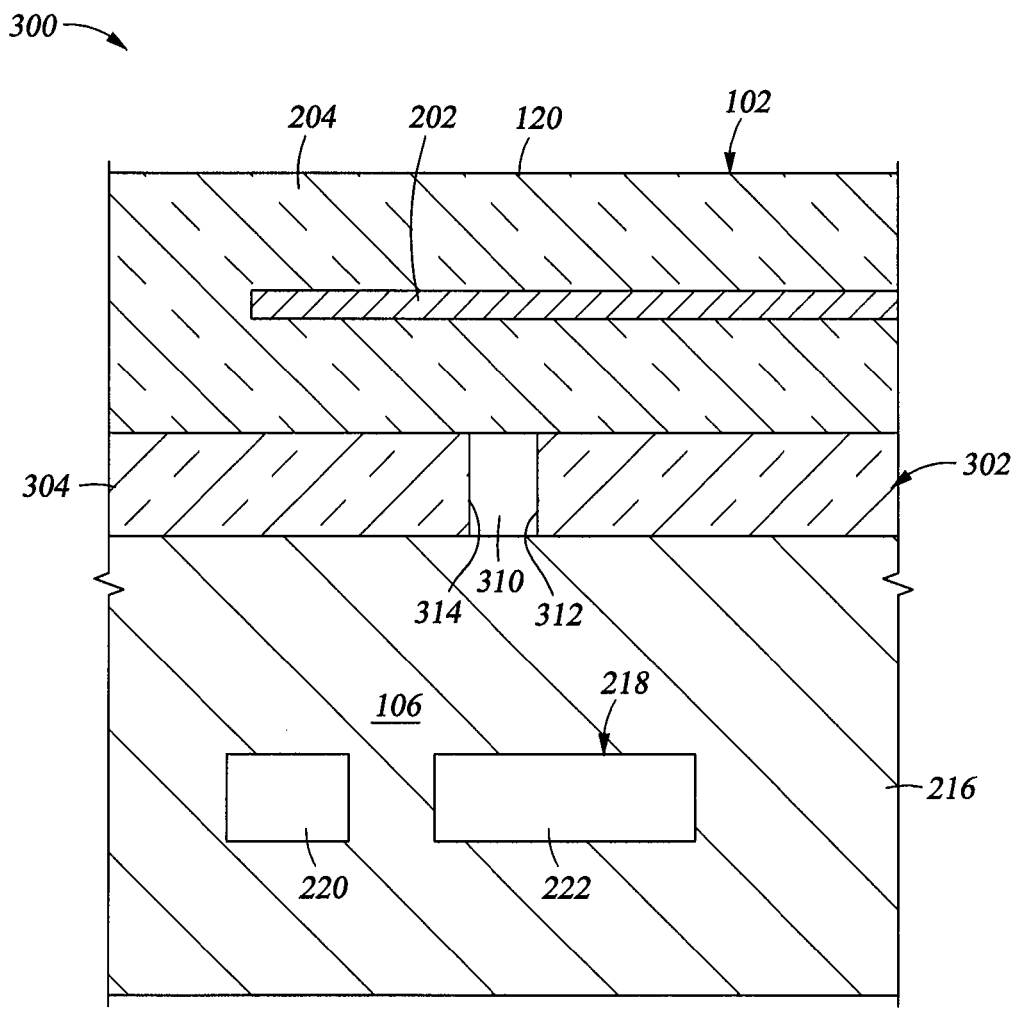
FIG. 3A is a partial cross-sectional view of the electrostatic chuck assembly of FIG. 3.

FIG. 3 is an exploded perspective view of one embodiment of an assembly comprising substrates bonded together illustrated as an electrostatic chuck assembly 300. FIG. 3A is a partial cross-sectional view of the electrostatic chuck assembly 300 of FIG. 3. Referring to both FIG. 3 and FIG. 3A, the electrostatic chuck assembly 300 includes an electrostatic puck 102 coupled to a temperature control base 106 by an adhesive layer 302. The electrostatic puck 102 includes a substrate support surface 120 on which a substrate (not shown) is electrostatically retained during vacuum processing. Although an exemplary electrostatic puck 102 and temperature control base 106 have been described above, electrostatic pucks and temperature control bases having alternative configurations may alternatively be utilized.

The adhesive layer 302 bonds the mating surfaces of the electrostatic puck 102 and the temperature control base 106. The adhesive layer 302 may include a number of holes formed therethrough, for example, lift pin holes 110 and/or other holes for backside gas, power delivery, thermocouples and the like. The adhesive layer 302 is comprised of one or more segments 304. In some embodiments, one or more of the segments 304 may be unconnected from the other segments 304 of the adhesive layer 302. Alternatively, one or more of the segments 304 may be connected to one or more of other segments 304 forming the adhesive layer 302.

The adhesive layer 302 is formed from an adhesive material having good thermal conductivity, for example materials having a thermal conductivity greater than about 0.3 Watt per meter degrees Kelvin (W/mK). Suitable materials for the adhesive layer 302 include, but are not limited to, acrylic-based adhesives, neoprene-based adhesives, silicone adhesives, epoxies, PSA (Pressure Sensitive Adhesives), thermoplastic adhesives, and thermoset adhesives, or a combination of these, among others. Examples of suitable adhesive materials include THERMATTACH® T412 adhesive, available from PARKER-CHOMERICS. In one embodiment, the adhesive layer 302 has a thickness of between about 10 to about 300 μm or greater. The adhesive layer 302 may also have a lap shear adhesion of at least about 40 pounds per square inch (PSI) and a tensile strength of about 40 PSI at 25 degrees Celsius. In one example, the peel strength between the electrostatic puck 102 and the temperature control base 106 is between about 2 pounds (about 0.91 kilogram) per linear inch and about 14 pounds (about 6.35 kilograms) per linear inch using an acrylic adhesive layer 302.

The bond material comprising the adhesive layer 302 may be in the form of an adhesive sheet (which can be preformed then laid down on either the electrostatic puck 102 or the temperature control base 106) or a fluid (e.g., a paste, gel or liquid that can be dispensed, screen printed or otherwise dispensed in a desired pattern). In one embodiment, the adhesive layer 302 is in the form of a plurality of precut segments 304 having a desired shape which are carefully laid up flat on one of the clean substrates (e.g., the electrostatic puck 102 or the temperature control base 106) and squeegeed to remove most air bubbles, a release liner is then removed from the unadhered surface of the adhesive layer and the other substrate (e.g., the other of the electrostatic puck 102 or the temperature control base 106) is precisely aligned on the adhesive layer 302, and subsequently subjected to a bonding procedure.

Figure 4:
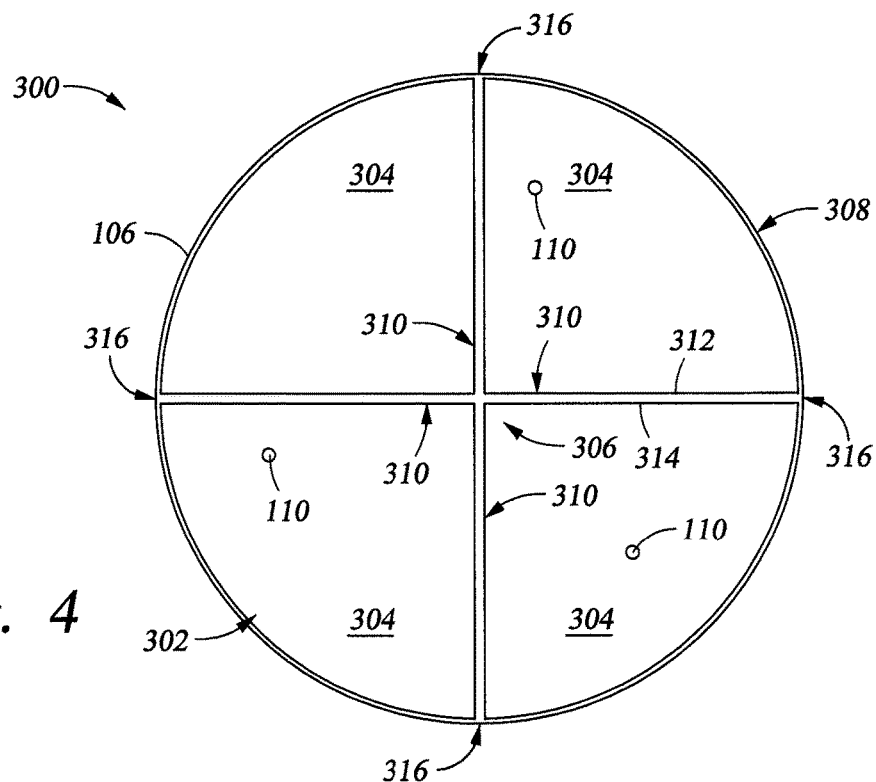
FIGS. 4-12 are cross-sectional views of alternative embodiments of channels formed in an adhesive layer.

The adhesive layer 302 is vented to an exterior diameter 308 (e.g., outer diameter of the adhesive layer 302, the electrostatic puck 102 or the temperature control base 106) of the electrostatic chuck assembly 100 through one or more channels 310 to provide a path through which volatiles outgassing from an interior region 306, such as the center of the electrostatic chuck assembly 100, may escape from between the electrostatic puck 102 and the temperature control base 106. The channels 310 may be in the plane or parallel to a plane of the adhesive layer 302, for example extending laterally between the electrostatic puck 102 and temperature control base 106. At least one of the channels 310 terminates at an outlet 316 formed on the exterior diameter 308 of the electrostatic chuck assembly 300. In the embodiment depicted in FIG. 3, at least one of the channels 310 is defined in the adhesive layer 302 between separated adhesive segments 304 which define the plane of the adhesive layer 302. For example in the embodiment depicted in FIG. 4, four channels 310 are illustrated, each channel 310 defined between facing edges 312, 314 of adjacent segments 304, with each channel 310 having an outlet 316 on the exterior diameter 308 of the electrostatic chuck assembly 300. Although four channels 310 arranged perpendicularly in the form of a cross are illustrated in FIG. 4, the channels 310 may be straight, circular, or have another configuration.

The outlet 316 of the channel 310 provides a vent path that allows volatiles outgassed by the adhesive layer 302, particularly during curing, to escape from between the electrostatic puck 102 and the temperature control base 106. Providing a vent path to the exterior diameter 308 of the electrostatic chuck assembly 300 via the channel 310 substantially prevents volatile gases from becoming trapped, thereby significantly reducing the chance of the adhesive layer 302 delaminating from one or both of the electrostatic puck 102 and the temperature control base 106. Additionally, since the vent path provided by the channel 310 substantially eliminates void formation, the thermal impedance between the electrostatic puck 102 and the temperature control base 106 remains uniform, which in turn leads to increased yield and productivity during processing of a workpiece of the chuck assembly 300. Further, in applications which utilize moisture-cured silicones as the adhesive layer 302, fully curing the adhesive layer 302 is enhanced by the delivery of moisture locally to bond sites within the interior region 306 of the adhesive layer 302 via the channel 310, even when the bond plane is thin and of high aspect ratio, e.g., in electrostatic chuck assemblies where the adhesive layer is thin (e.g., about 1-500 urn) and the diameter of the substrates is large (e.g., greater than about 150 mm).

The channel 310 also provides a path for infiltration of a bond weakening agent, such as solvents, utilized to weaken the adhesive layer 302, thereby allowing the substrates (e.g., the electrostatic puck 102 and temperature control base 106) to be more easily separated for refurbishment. Thus, the channels 310 allow a faster and more cost efficient refurbishment, with a significant reduction in damage to the electrostatic puck 102 and temperature control base 106, as compared to conventional methodology employed to remove monolithic adhesive layers in conventional electrostatic chuck assemblies.

The channels 310 generally create an open area in the adhesive layer 302. The open area of the adhesive layer 302 may be as much as 50 percent of the adhesive layer 302. In one embodiment, the channels 310 (and other perforations of the adhesive layer 302) define an open area of less than about 1% to about 50% percent of the adhesive layer 302.

The channels 310 may also be partially defined in one or both of the electrostatic puck 102 and temperature control base 106. The channels 310 may be narrow, having a width of less than about 10 mm, as to promote heat transfer uniformity. As the channel 310 runs in contact with the adhesive layer 302 along substantially all of its length, the portion of the channel 310 directly exposed and bounded by the adhesive layer 302 is exponentially greater than the circumference of the channel 310.

Another advantage of having a discontinuous adhesive layer 302 is a reduction in stress on the adhesive layer 302. As the electrostatic puck 102 and the temperature control base 106 may have different coefficients of thermal expansion, the stress generated when these substrates are heated is absorbed by the adhesive layer 302. Thus, the number, position and width of the channels 310 may be selected to maintain stress in the adhesive layer 302 at levels which do not detrimentally affect the life of the adhesive material, cause delamination or disrupt the flatness of the substrate support surface 120 of the electrostatic puck 102. Generally, more segments 304 and channels 310 allow greater stresses to be accommodated by the adhesive layer 302.

In alternative embodiments wherein the channels 310 do not terminate at the exterior diameter 308 of the electrostatic chuck assembly 300, the gap provided between segments 304, across the channels 310, may be utilized for managing the stress within the adhesive layer 302. The gap in the adhesive layer 302 minimizes the effects from a miss-match in the thermal expansion between the electrostatic puck 102 and the temperature control base 106 which could adversely affect the flatness of the substrate support surface 120 of the electrostatic puck 102.

Figure 3B:
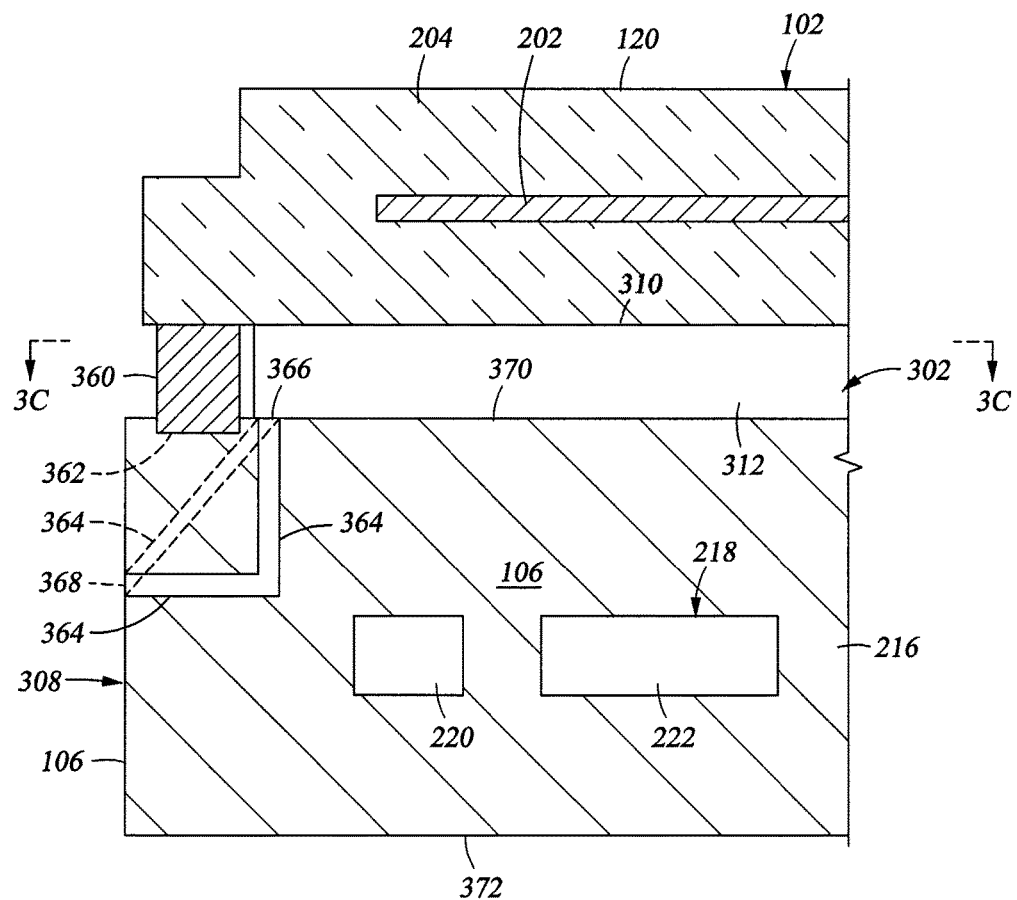
FIG. 3B is a partial cross-sectional view of the electrostatic chuck assembly of FIG. 3 having a seal ring.
Figure 3C:
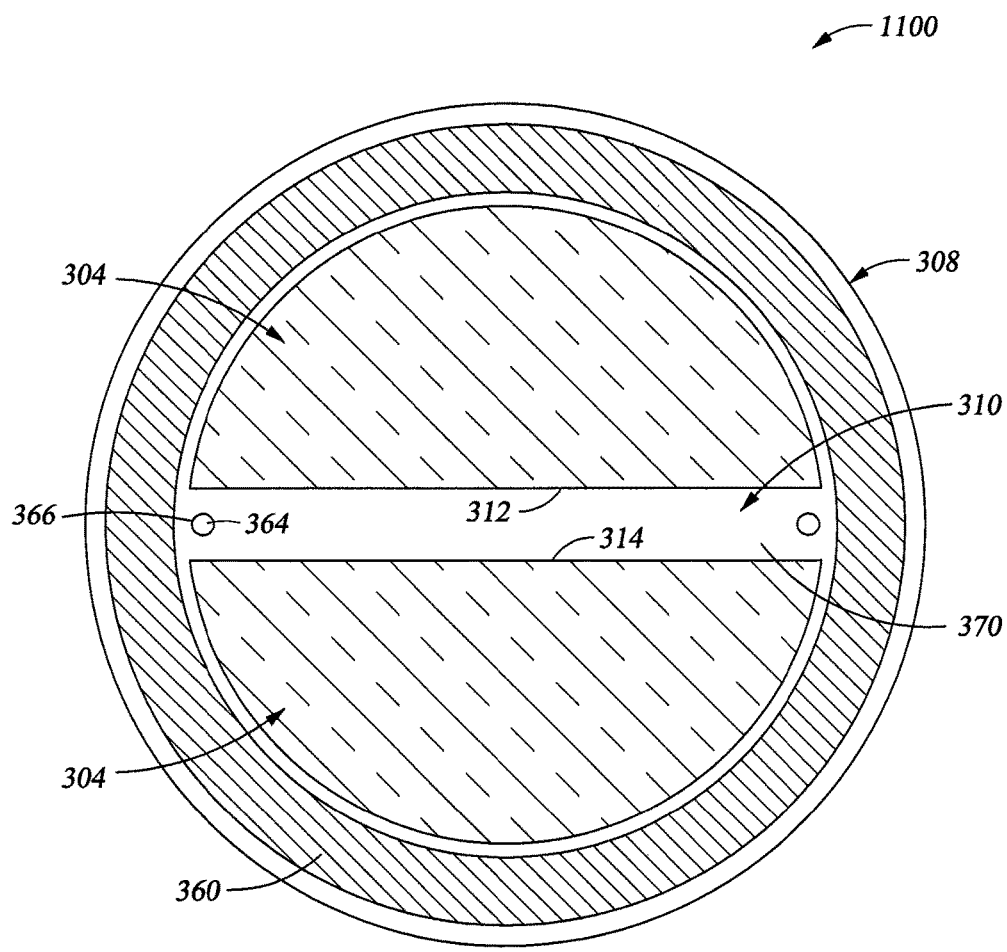
FIG. 3C is a cross-sectional view of the electrostatic chuck assembly taken along section line 3C-3C of FIG. 3B illustrating a channel formed in an adhesive layer.

FIG. 3B is a partial cross-sectional view of the electrostatic chuck assembly 300 of FIG. 3 having a seal ring 360. Referring additionally to the cross-sectional view of the electrostatic chuck assembly 300 taken along section line 3C-3C of FIG. 3B, the seal ring 360, such as an o-ring or gasket, may be disposed at the bond-line between the electrostatic puck 102 and temperature control base 106. Additionally, the seal ring 360 may be retained in a seal retaining gland 362 formed in the temperature control base 106. In such embodiments, the venting of the interior region 306, for the out gassing species from the adhesive layer 302, may utilize a passage 364 formed through the temperature control base 106 coupling one of more of the channels 310 to the exterior diameter 308 of the temperature control base 106.

The passage 364 has an opening 366 formed on an upper surface 370 of the temperature control base 106 that faces the electrostatic puck 102. The passage 364 has an opening 368 formed on the exterior diameter 308 of the electrostatic chuck assembly 300 between the upper surface 370 and lower surface 372 of the temperature control base 106. The passage 364 may be formed by two connecting passages, for example, two intersecting drill holes, or by a single hole formed at an acute angle relative to a centerline of the temperature control base 106. The spacing of the opening 368 away from the substrate support surface 120 of the electrostatic puck 102 allows any volatiles outgassed during processing to enter the interior volume of the processing chamber downstream of the substrate being processed thereby reducing potential contamination of the substrate.

Alternatively, the passage 364 may be in the form of a groove (not shown) provided laterally across the seal retaining gland 362 that allows the channel 310 between the adhesive segments 304 to leak around the seal ring 360 to the exterior diameter 308 of the electrostatic chuck assembly 300.

FIGS. 5-12 are cross-sectional views of alternative embodiments of an adhesive layer having at least one channel with an outlet exposed to an exterior of an electrostatic chuck assembly which may be substituted for the adhesive layer 302 described above. Although the adhesive layer is shown disposed on the temperature control base, the adhesive layer may alternatively be disposed on the electrostatic puck prior to adherence to the temperature control base.

Figure 5:
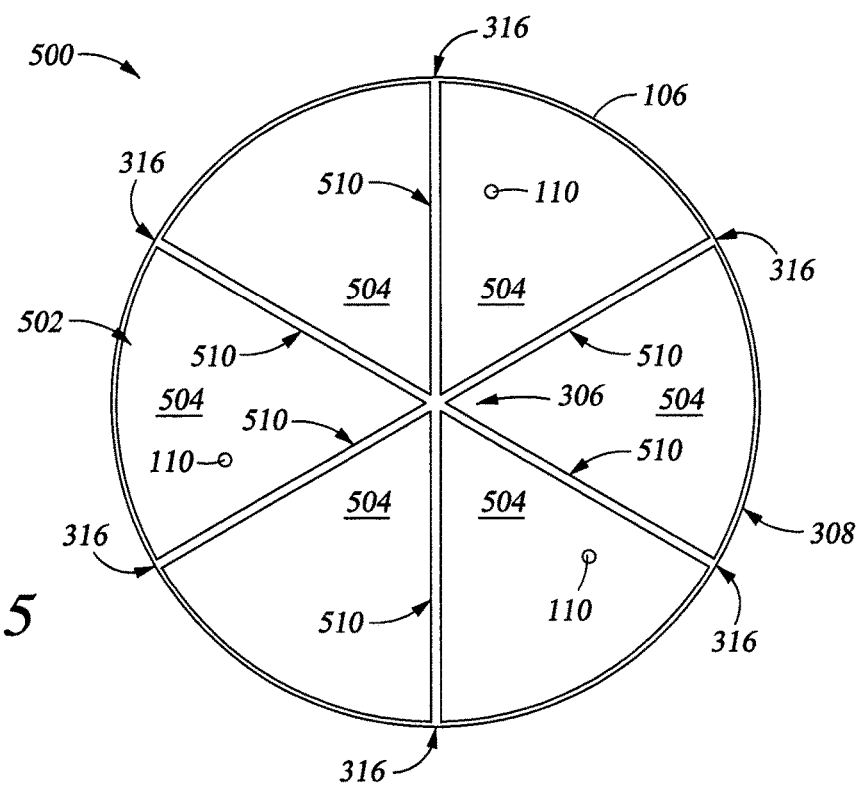

Referring now to the sectional view of FIG. 5, an electrostatic chuck assembly 500 is shown with the electrostatic puck 102 removed to reveal the underlying adhesive layer 502 disposed on the temperature control base 106. The adhesive layer 502 may be fabricated in a similar fashion as the adhesive layer 302 described above.

The adhesive layer 502 includes a plurality of segments 504 arranged in a pie-shaped configuration such that the channels 510 defined between the segments 504 pass through an interior region 306 of the adhesive layer 502. At least one channel 510 has an outlet 316 disposed on an exterior diameter 308 of the electrostatic chuck assembly 500 to provide a path for gases to efficiently escape, or off gas, from the adhesive layer 502. The gases may even successfully off gas for embodiments wherein the adhesive layer 502 exceeds 450 mm in diameter. The channels 510 pass through a centerline of the electrostatic chuck assembly 500, which promote uniform and thorough curing of the adhesive layer 502. The channels 510 efficiently remove volatile gases. Additionally, the channels 510 facilitating efficient delivery of a bond weakening agent to the interior region 306 of the adhesive layer 502 for rapid and substantially trouble-free debonding of the electrostatic puck 102 from the temperature control base 106 during refurbishment.

Figure 6:
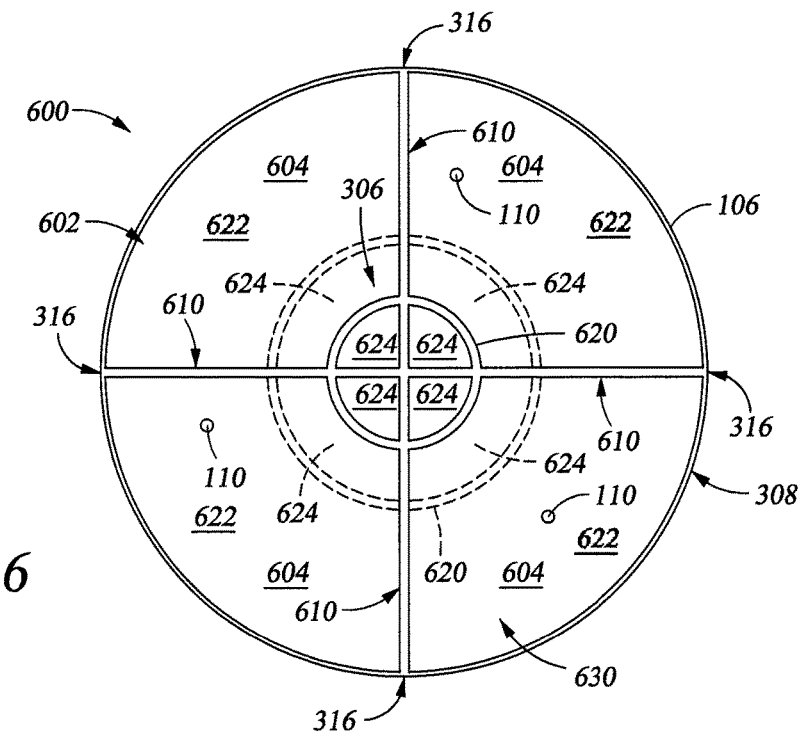

Referring now to the sectional view of FIG. 6, an electrostatic chuck assembly 600 has the electrostatic puck 102 removed (e.g., not shown in FIG. 6) to reveal the underlying adhesive layer 602 disposed on the temperature control base 106. The adhesive layer 602 may be fabricated in a fashion similar to the adhesive layers described above and utilized to secure the puck 102 the base 106.

The adhesive layer 602 includes a plurality of segments 604 arranged in a pie-shaped configuration such that the channels 610 defined between the segments 604 pass through an interior region 306 of the adhesive layer 602. At least one channel 610 has an outlet 316 disposed on an exterior diameter 308 of the electrostatic chuck assembly 600. The channel 610 provides a path for gases to efficiently escape, or off gases, from the adhesive layer 602. The gases may even successfully off gas in embodiments wherein the adhesive layer 602 exceeds a diameter of about 450 mm. In one embodiment, the channels 610 may pass through a centerline of the electrostatic chuck assembly 600.

In one embodiment, the segments 604 comprising the adhesive layer 602 may be grouped into at least one outer segment 622 and at least one inner segment 624. The outer segment 622 is disposed radially outward of the inner segment 624. The outer segment 622 and inner segment 624 are separated by an interior channel 620. The interior channel 620 may be coupled to at least one of the channels 610 terminating at the outlet 316 so that the portions of the segments 604 exposed to the channels 620 may be vented. Additional interior channels 620 (shown in phantom) may be utilized to create concentric groups of inner segments 624 (also shown in phantom).

In one embodiment, the outer segments 622 and the inner segments 624 may be fabricated from a different adhesive material. For example, the adhesive material comprising the outer segments 622 may have a higher heat transfer coefficient than the adhesive material comprising the inner segments 624. The electrostatic puck 102 may be cooled preferentially at the center to compensate for processes that heat the center of a wafer disposed on the electrostatic chuck assembly 600 faster than the edges of the wafer. Alternatively, the adhesive material comprising the outer segments 622 may have a lower heat transfer coefficient than the adhesive material comprising the inner segments 624. The electrostatic puck 102 may be cooled preferentially at the edge relative to the center of the electrostatic puck 102. In another embodiment having concentric groups of inner segments 624, the inner and outer groups of inner segments 624 may be fabricated from different adhesive materials to provide three or more zones with different heat transfer rates between the electrostatic puck 102 and temperature control base 106.

In yet another embodiment, the adhesive material comprising the outer segments 622 may have a greater peel and/or tensile strength relative to the adhesive material comprising the inner segments 624. Alternatively the adhesive material comprising the outer segments 622 may have a lower peel and/or tensile strength relative to the adhesive material comprising the inner segments 624. In this manner, the strength of the material bond comprising the inner segments 624 relative to the outer segments 622 may be selected to prevent bowing and/or maintain flatness of the substrate support surface 120 after thermal loading due to differences in the electrostatic puck 102 and the temperature control base 106 coefficient of thermal expansion. The inner and outer groups of inner segments 624 may also be fabricated from a different adhesive material to provide three or more zones, or concentric zones, with different adhesive strength coupling the electrostatic puck 102 to the temperature control base 106. The use of different strength for the adhesive materials may prevent undesired changes to the flatness of the substrate support surface 120 and reduce and/or eliminate the need to refurbish, or flatten, the substrate support surface 120 by chemical mechanical polishing. Additionally, in embodiments wherein the channels 610 do not terminate at the exterior diameter 308 of the electrostatic chuck assembly 600, using adhesive material having different strengths on the different segments 604 may manage stress within the adhesive layer 602 and promote flatness of the substrate support surface 120.

As illustrated in FIG. 6, the open area of the adhesive layer 602 may be selected by the width, number and location of the channels 610, 620 to create a more open area in one location relative to another. The different open areas may be utilized to tailor the strength and/or heat transfer characteristics across the adhesive layer 602. For example, the channels 610, 620 may be configured to provide a greater percentage of open area in the interior region 306 relative to an outer region 630 proximate the exterior diameter 308 of the electrostatic chuck assembly 600. The greater percentage of open area at the interior region 306 will result in less heat transfer between the electrostatic puck 102 and temperature control base 106 at the center of the electrostatic puck 102 relative the perimeter of the electrostatic puck 102. The difference in the heat transfer rate for the interior region 306 and the perimeter of the electrostatic puck 102 may compensate for processes that heat the perimeter of the wafer faster than the interior region 306 of the wafer. Conversely, the channels 610, 620 may be configured to provide a smaller percentage of open area in the interior region 306 relative an outer region 630 of the adhesive layer 602. The smaller percentage of open area in the interior region 306 allows more heat transfer through the interior region 306, or center, of the electrostatic puck 102 relative the outer region of the electrostatic puck 102.

Figure 7:
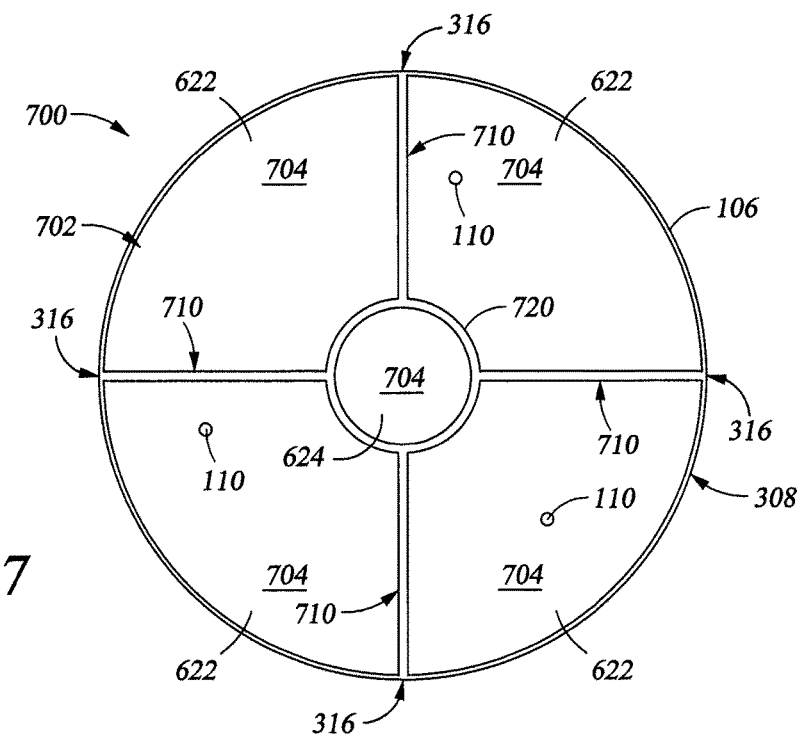

Referring now to the sectional view of FIG. 7, an electrostatic chuck assembly 700 has the electrostatic puck 102 removed (e.g., not shown in FIG. 7) to reveal the underlying adhesive layer 702 disposed on the temperature control base 106. The adhesive layer 702 may be fabricated in a fashion similar to the adhesive layers described above and utilized to secure the puck 102 the base 106. More particularly, the electrostatic chuck assembly 700 is substantially identical to the electrostatic chuck assembly 600 described above, except channels 710, having a first end terminating at outlets 316, are connected at a second end to an inner channel 720.

The adhesive layer 702 includes a plurality of segments 704 arranged in a truncated pie-shaped configuration. Each channel 710 may terminate one end at the inner channel 720 and another end at an outlet 316 disposed on an exterior diameter 308 of the electrostatic chuck assembly 700. The channel 710 provides a path for gases to efficiently escape from the adhesive layer 702.

The segments 704, comprising the adhesive layer 702, may be grouped into at least one outer segment 622 and at least one inner segment 624. The outer segment 622 is disposed radially outward of the inner segment 624. The outer segment 622 and inner segment 624 are separated by the interior channel 720.

The inner segment 624 may be fabricated from an adhesive material different than that of the outer segment 622. As discussed above with reference to the inner and outer segments 624, 622, the adhesive material comprising the outer segments 622 may have a higher or lower heat transfer coefficient than the adhesive material comprising the inner segments 624. In this manner the electrostatic puck 102 may be thermally regulated with an edge to center gradient. In another embodiment, the adhesive material comprising the outer segments 622 may have a greater or lower peel and/or tensile strength relative to the adhesive material comprising the inner segments 624. For example, the adhesive material comprising the outer segments 622 may be selected from an acrylic-based adhesive, a neoprene-based adhesive, a silicone adhesive or the like which provides a lower peel and/or tensile strength relative to an adhesive material comprising the inner segments 624, such as an epoxy. In this manner, the strength of the material comprising the inner segments 624 relative the outer segments 622 may be selected to prevent bowing and/or maintain flatness of the substrate support surface 120 of the electrostatic puck 102 after thermal loading due to mismatches in the coefficient of thermal expansion between the electrostatic puck 102 and temperature control base 106. In an alternative embodiment, the adhesive material comprising the outer segments 622 may be selected to provide a higher peel and/or tensile strength relative to an adhesive material comprising the inner segments 624. In embodiments having concentric groups of inner segments 624 (not shown), the inner and outer groups of inner segments 624 may also be fabricated from a different adhesive material to provide three or more zones. For example, the inner segments 624 zones, coupling the electrostatic puck 102 to the temperature control base 106, may be concentric and of different adhesive strength and/or coefficients of thermal conductivity.

Figure 8:
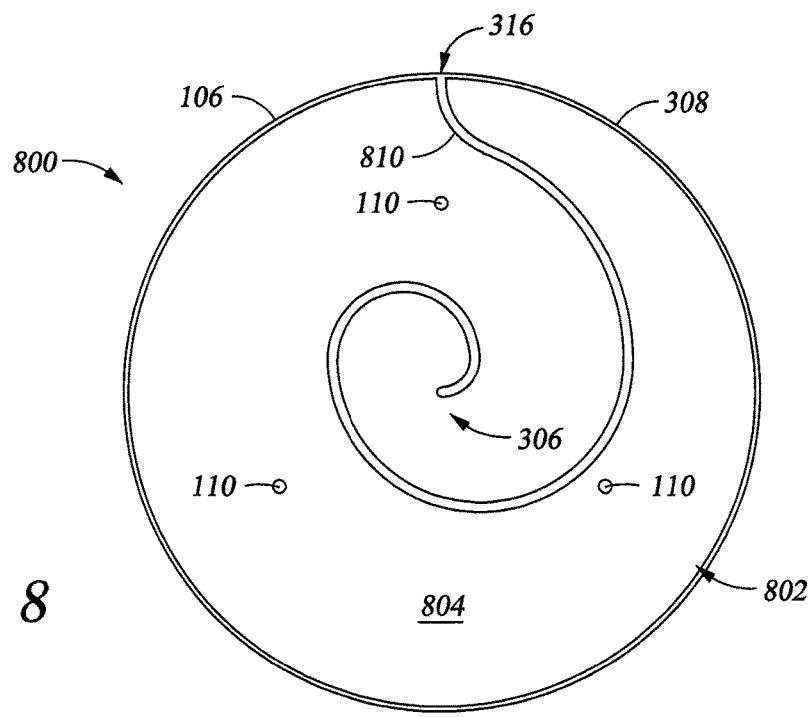

Referring now to FIG. 8, an electrostatic chuck assembly 800 has the electrostatic puck 102 removed (e.g., not shown in FIG. 8) to reveal the underlying adhesive layer 802 disposed on the temperature control base 106. The adhesive layer 802 may be fabricated in a similar fashion as the adhesive layers described above and utilized to secure the puck 102 the base 106. More particularly, the electrostatic chuck assembly 800 is substantially identical to the electrostatic chuck assemblies described above, except the adhesive layer 802 may include at least one channel 810 that terminates at an outlet 316. A single channel 810 forms a spiral pattern extending inward toward the interior region 306. The single spiraling channel 810 in the adhesive layer 802 may additionally provide a single segment 804. The spiraling channel 810 facilitates venting the interior region 306 of the adhesive layer 802.

Figure 9:
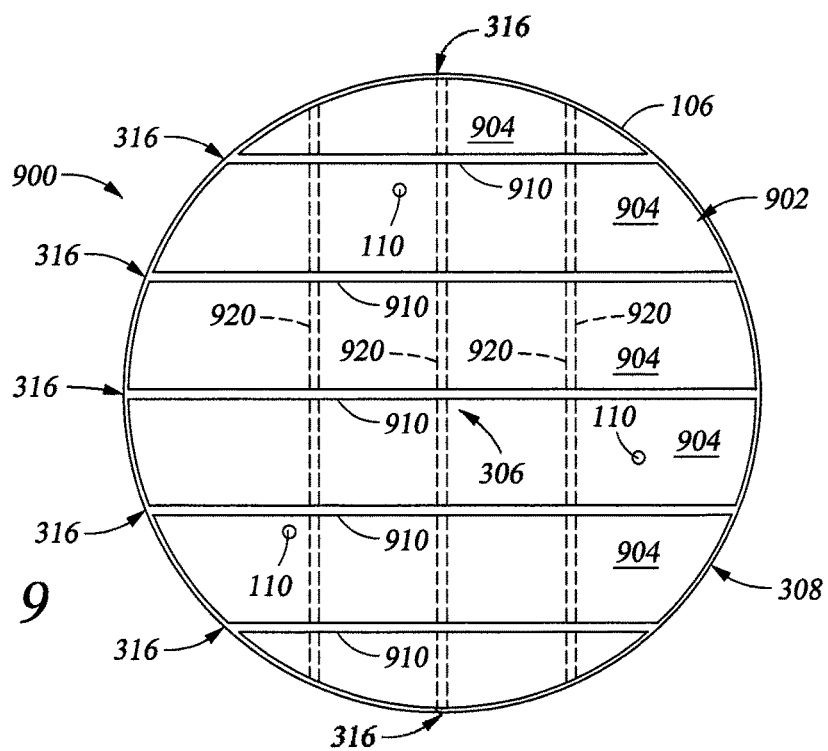

Referring now to FIG. 9, an electrostatic chuck assembly 900 has the electrostatic puck 102 removed (e.g., not shown in FIG. 9) to reveal the underlying adhesive layer 902 disposed on the temperature control base 106. The adhesive layer 902 may be fabricated in a similar fashion as the adhesive layers described above and utilized to secure the puck 102 the base 106.

As shown in FIG. 9, the adhesive layer 902 includes at least one channel 910 with two opposing ends wherein each end terminates at a separate outlet 316. In one embodiment, a plurality of channels 910 may be formed in rows. The rows of channels 910 may be linear, curved, sinusoidal or other shape. In one embodiment, the rows of channels 910 may be linear and parallel defining the segments 904 therebetween. Optionally, the adhesive layer 902 may include secondary channels 920 (shown in phantom) that are disposed at a non-zero angle relative to the channels 910 thereby forming a grid of segments 904. At least one end of the secondary channels 920 terminates at an outlet 316. In one embodiment, the secondary channels 920 may be disposed at about 90 degrees relative to the channels 910.

Figure 10:
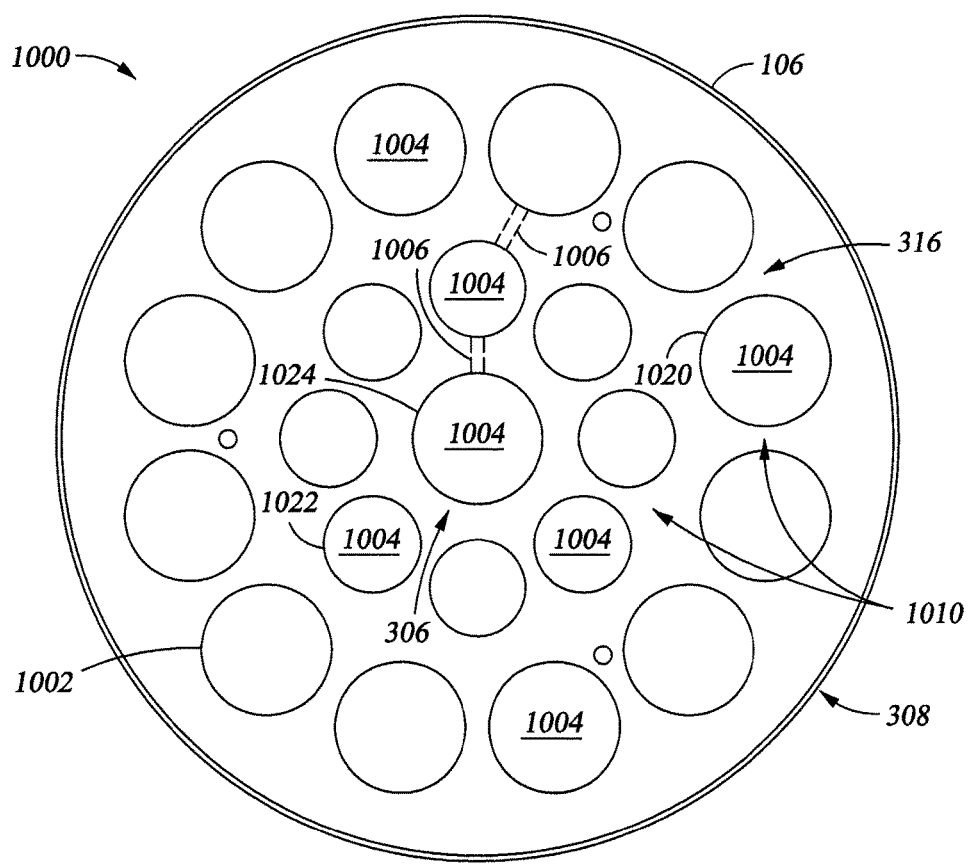

Referring now to the sectional view of FIG. 10, an electrostatic chuck assembly 1000 has the electrostatic puck 102 removed (e.g., not shown in FIG. 10) to reveal the underlying adhesive layer 1002 disposed on the temperature control base 106. The adhesive layer 1002 may be similarly fabricated as the adhesive layers described above and utilized to secure the puck 102 the base 106. More particularly, the adhesive layer 1002 of the electrostatic chuck assembly 1000, may include a plurality of discreet segments 1004. One or more of the discreet segments 1004 may optionally be connected by a web 1006 (shown in phantom) of adhesive. Channels 1010, defined between the discreet segments 1004, are exposed to an exterior diameter 308 through outlets 316. The channels 1010 vent an interior region 306 of the adhesive layer 1002 through the outlets 316.

The number, size, position and density of the discreet segments 1004 are selected to control the open area of the adhesive layer 1002. The open area, and percentage of open area between regions of the electrostatic chuck assembly 1000 may be selected to control the heat transfer rate and/or adhesion strength profile across the electrostatic chuck assembly 1000, as discussed above.

For example, the segments 1004 defining the adhesive layer 1002 may be grouped into an outer segment group 1020, an intermediate segment group 1022 and an inner segment group 1024. Each segment group 1020, 1022, 1024 may include one or more segments 1004 which may be separated by channel 1010. The outer segment group 1020 may be disposed radially outward of the intermediate segment group 1022. The intermediate segment group 1022 may be disposed radially outward of the inner segment group 1024.

One or more of the segments 1004, comprising each segment groups 1020, 1022, 1024, and/or the segment groups 1020, 1022, 1024, may be fabricated from different adhesive materials. As discussed above with reference to the inner and outer segments 624, 622, of FIG. 6, the adhesive material comprising one or more segments 1004 in a particular segment group may have a higher or lower heat transfer coefficient and/or strength than the adhesive material comprising the other segments 1004 within that group. For example, the adhesive material comprising the outer segments group 1020 may be selected from an acrylic-based adhesive, a neoprene-based adhesive, a silicone adhesive or the like which provides a lower peel and/or tensile strength relative to an adhesive material comprising the inner segment group 1024, such as an epoxy. In this manner, the electrostatic puck 102 may be thermally regulated with an azimuthal gradient, which may be selected to correct or compensate for other azimuthal non-uniformities within the processing chamber. The strength of the materials for the inner segments group 1024, relative the outer segment group 1020, may be selected to prevent bowing and/or maintain flatness of the substrate support surface 120 due to induces stress in the adhesive layer 1002 from thermal loading. The thermal loading may occur from mismatches in the coefficient of thermal expansion between the electrostatic puck 102 and temperature control base 106.

Figure 11:
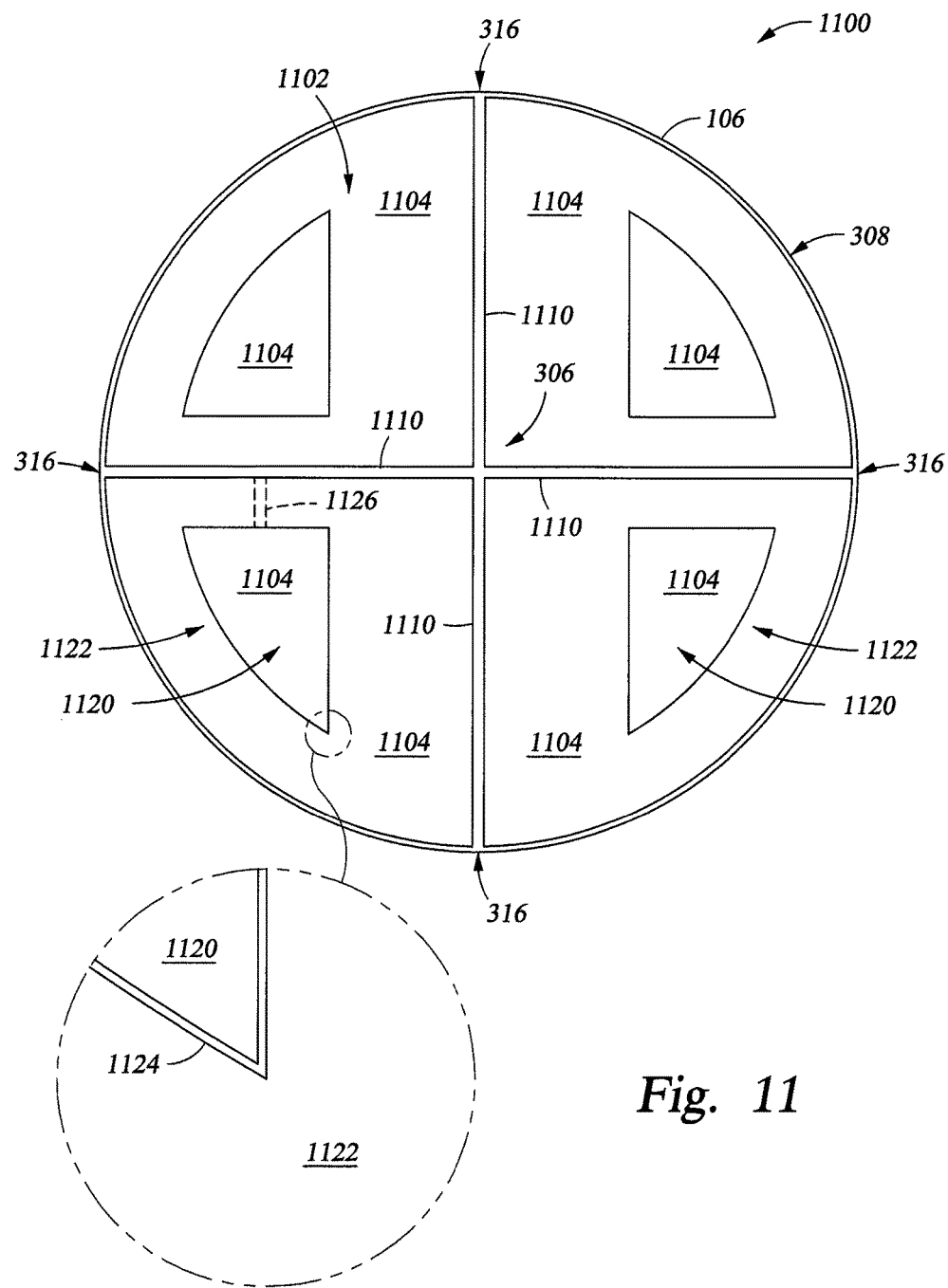

Referring now to FIG. 11, an electrostatic chuck assembly 1100 has the electrostatic puck 102 removed (e.g., not shown in FIG. 11) to reveal the underlying adhesive layer 1102 disposed on the temperature control base 106. The adhesive layer 1102 may be similarly fabricated as the adhesive layers described above and utilized to secure the puck 102 the base 106. More particularly, the electrostatic chuck assembly 1100 is substantially identical to the electrostatic chuck assemblies described above, except the adhesive layer 1102 may include a plurality of segments 1104 separated by at least one channel 1110 that terminates at an outlet 316. Additionally, the plurality of segments 1104 may include at least one primary segment 1122 that circumscribes at least one secondary segment 1120. The secondary segment 1120 may be touching the circumscribing primary segment 1122, or the segments 1120, 1122 may be separated by a secondary channel 1124. The secondary channel 1124 may be isolated from the channel 1110, or alternatively connected thereto by a connecting channel 1126 (shown in phantom). The vent path provided by the channels 1110 facilitates escape of gases from between the electrostatic puck 102 and temperature control base 106. Additionally, the channels 1110 may facilitate the introduction of a bond weakening agent to the interior region 306 of the adhesive layer 1102. The adhesive materials used in fabricating the segments 1120, 1122 may be similar or may be different. The selection of the adhesive materials may be used to control the heat transfer profile, manage stresses within the adhesive layer 1102 and/or control the flatness for the substrate support surface 120.

Figure 12:
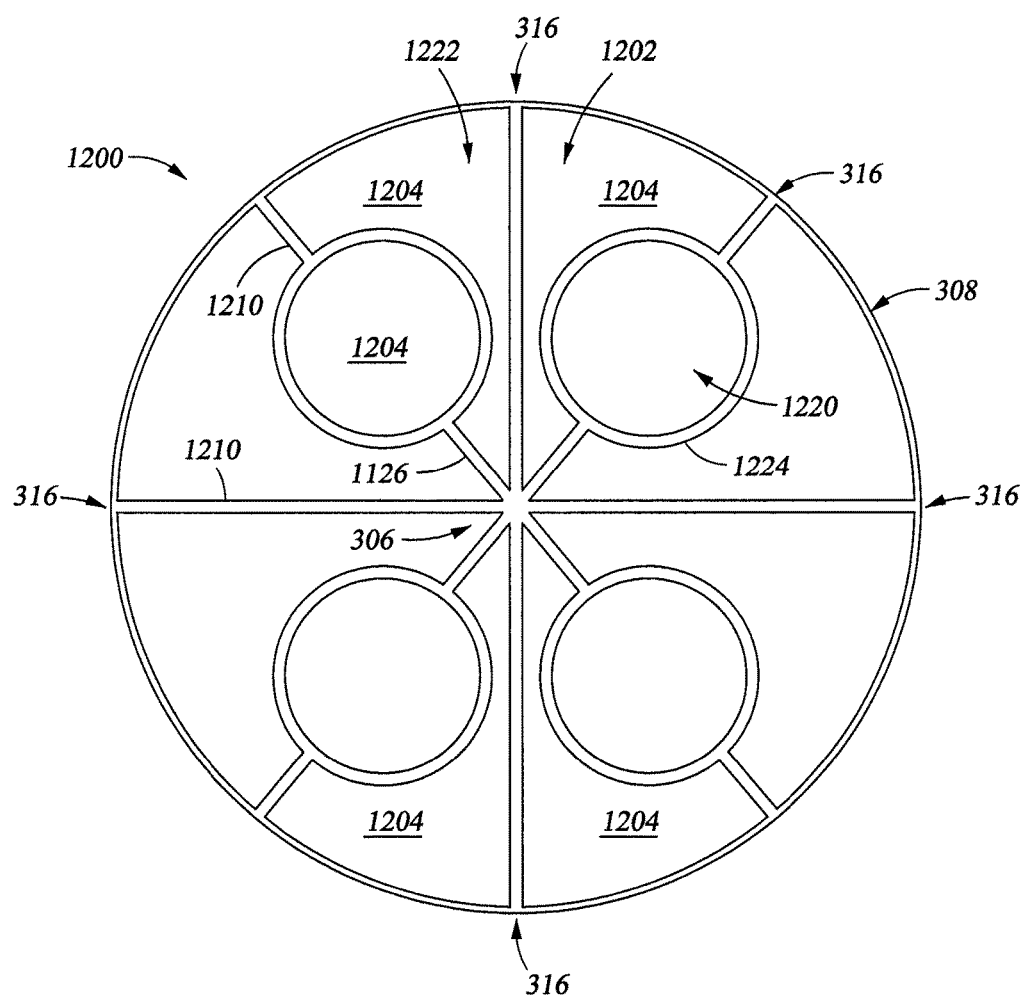

Referring now to FIG. 12, an electrostatic chuck assembly 1200 has the electrostatic puck 102 removed (e.g., not shown in FIG. 12) to reveal the underlying adhesive layer 1202 disposed on the temperature control base 106. The adhesive layer 1202 may be similarly fabricated as the adhesive layers described above and utilized to secure the puck 102 the base 106. The electrostatic chuck assembly 1200 is substantially identical to the electrostatic chuck assembly 1100 described above. More particularly, the adhesive layer 1202 includes a plurality of segments 1204 separated by at least one channel 1210 that terminates at an outlet 316. The plurality of segments 1204 include at least one primary segment 1222 that circumscribes at least one secondary segment 1220, except wherein a secondary channel 1224 separating the segments 1220, 1222 is connected by a connecting channel 1226 to the channel 1210. The vent path provided by the channels 1210 facilitates escape of gases from between the electrostatic puck 102 and temperature control base 106. Additionally, the vent path facilitates the introduction of a bond weakening agent to the interior region 306 of the adhesive layer 1202. The adhesive materials used in fabricating the segments 1220, 1222 may be the similar or different. The selection of the adhesive materials may be used to control the heat transfer profile, manage stresses within the adhesive layer 1102 and/or control the flatness for the substrate support surface 120.

Figure 13:
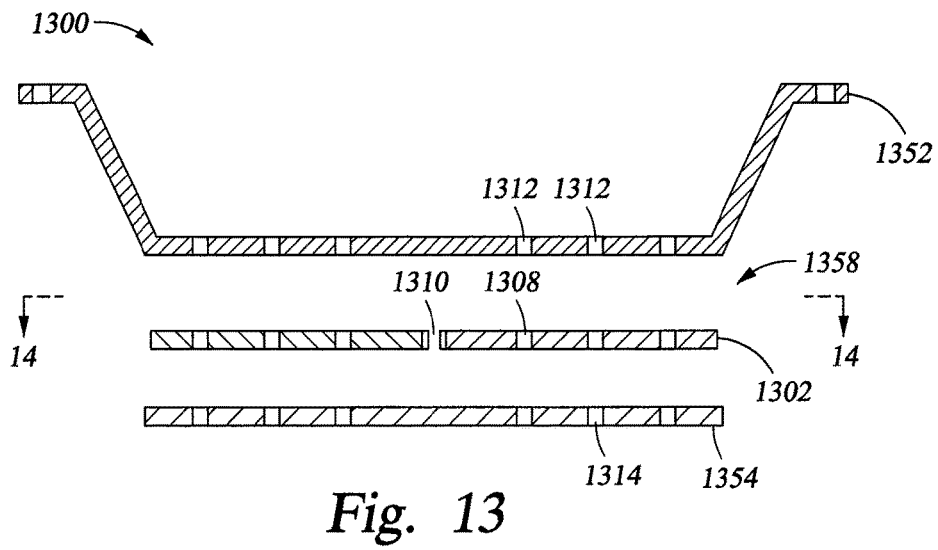
FIG. 13 is an exploded sectional view of a showerhead assembly in accordance with one embodiment of the invention.
Figure 14:
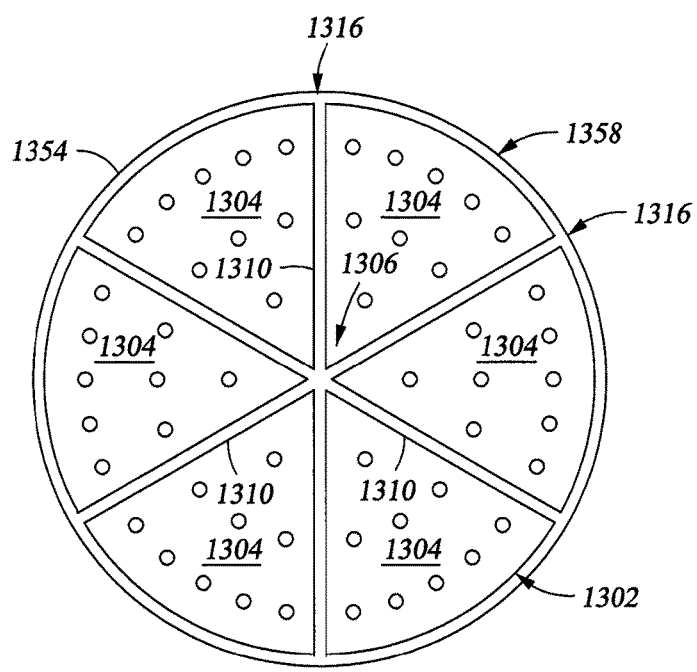
FIG. 14 is a sectional view of the showerhead assembly of FIG. 13 illustrating an exemplary configuration of channels formed in an adhesive layer.

FIG. 13 is an exploded sectional view of a showerhead assembly 1300 comprising substrates bonded together. FIG. 14 is a cross-sectional view of the showerhead assembly 1300 taken along section line 14-14 of FIG. 13. Referring to both FIG. 13 and FIG. 14, the showerhead assembly 1300 includes a showerhead 1352 coupled by an adhesive layer 1302 to a gas distribution plate 1354. The adhesive layer 1302 includes a plurality of holes 1308 that align with holes 1312, formed in the showerhead 1352 and holes 1314 formed in the gas distribution plate 1354. The holes 1312, 1324 allow gas to pass through the showerhead assembly 1300 during wafer processing.

The adhesive layer 1302 bonds the mating surfaces of the showerhead 1352 and the gas distribution plate 1354. The adhesive layer 1302 is comprised of one or more segments 1304. In embodiments having two or more segments 1304, one or more of the segments 1304 may be separated from the other segments 1304 by a channel 1310. Alternatively, one or more of the segments 1304 may be continuous with one or more of other segments 1304 forming the adhesive layer 1302. The adhesive layer 1302 may be formed from an adhesive material to control the heat transfer profile, manage stresses within the adhesive layer 1302 and/or control the flatness for the gas distribution plate 1354 of the showerhead assembly 1300.

The adhesive layer 1302 is vented to an exterior diameter 1358 (e.g., outer diameter) of the showerhead assembly 1300 through one or more channels 1310. Volatiles from an interior region 1306 of the adhesive layer 1302, between the showerhead 1352 and the gas distribution plate 1354, may outgas from the center of the showerhead assembly 1300 through the one or more channels 1310. At least one of the channels 1310 terminates at an outlet 1316 formed on the exterior diameter 1358 of the showerhead assembly 1300. In one embodiment, at least one of the channels 1310 is defined in the adhesive layer 1302 between separated adhesive segments 1304 which define the plane of the adhesive layer 1302. Although six channels 1310 arranged about 60 degrees are illustrated in FIG. 13, the channels 1310 may have other geometry, density, width, number, spacing or other configuration. The adhesive layer 1302, channels 1310 and/or segments 1304 may additionally be configured in any of the manners discussed above with reference to the adhesive layer utilized in the electrostatic puck to realize the advantages described above.

The channel 1310 also provides a path to the interior region of the adhesive layer 1302 for a bond weakening agent to weaken the adhesive layer 1302. The bond weakening agent allows the substrates (e.g., the showerhead 1352 and gas distribution plate 1354) to be more easily separated for refurbishment. Thus, the channels 1310 allow a faster and more cost efficient refurbishment of the showerhead assembly 1300, with a significant reduction in damage to the showerhead 1352 and gas distribution plate 1354, as compared to conventional methodology employed to remove monolithic adhesive layers in conventional showerhead assemblies.

FIG. 15 is an exploded top perspective view of an assembly 1500. The assembly 1500 includes at least two substrates 1502, 1506 secured by an adhesive layer 1504. The assembly 1500 additionally includes at least one channel 1510 configured to vent the adhesive layer 1504 to an exterior 1550 of the assembly 1500. The channel 1510 provides a path for volatiles outgassing from the adhesive layer 1504 to escape from between the substrates 1502, 1506.

The assembly 1500 may be a system or component designed for use under vacuum conditions, in an ultraclean (e.g., cleanroom) environment, in a plasma processing system or other system to mitigate contamination from outgassing and/or risk of delamination due to gas outgassing from the adhesive layer between substrates 1502, 1506. The assembly 1500 may also be a component where chemical weakening of the adhesive layer 1504 may be desired for later separation of the substrates 1502, 1506.

The assembly 1500 may be a component for a semiconductor vacuum processing chamber having at least a portion of the exterior surface 1550 of the assembly 1500 exposed to a plasma environment. In one embodiment, the assembly 1500 is a lid assembly, wherein the first substrate 1502 is a first portion of the lid and the second substrate 1506 is a second portion of the lid, such as a heater. In another embodiment, the assembly 1500 is a substrate support pedestal assembly, wherein the first substrate 1502 is a first portion of a substrate support pedestal and the second substrate 1506 is a second portion of the substrate support pedestal, such as a heater. In another embodiment, the assembly 1500 is a liner assembly for a chamber wall or substrate support, wherein the first substrate 1502 is a first portion of a liner and the second substrate 1506 is a second portion of the liner. In yet another embodiment, the assembly 1500 may be a two-part ring, such as a cover ring, deposition ring, focus ring and the like, wherein the first substrate 1502 is a first portion of the ring and the second substrate 1506 is a second portion of the ring. In still another embodiment, the assembly 1500 is two-part shield, wherein the first substrate 1502 is a first portion of the shield and the second substrate 1506 is a second portion of the shield.

The adhesive layer 1504 may be fabricated and configured as described above with reference to FIGS. 3-12. One or more channels 1510 formed through the adhesive layer 1504 have at least one outlet 1512 on the exterior 1550 of the assembly 1500 to facilitate outgassing of the adhesive layer 1504. Additionally, the one or more channels 1510, formed through the adhesive layer 1504, may be used to introduce a bond weakening agent to an interior region 1514 of the adhesive layer 1504 for separating the bonded substrates 1502, 1506.

The channel 1510 formed through the adhesive layer 1504 may additionally include a portion 1602 formed in at least one of the substrates 1502, 1506, as shown in FIG. 16. The formation of the portion 1602 of the channel 1510 in at least one of the substrates 1502, 1506 substantially ensures that the channel 1510 will not close in the event that sidewalls 1606 of the adhesive layer 1504 bounding the channel 1510 bulge as indicated by phantom line 1604 due to stresses induced in the adhesive layer 1504, mis-positioning of the segments 1508 or for other reasons.

FIG. 17 is an exploded top perspective view of an assembly 1700. The assembly 1700 includes at least two substrates 1702, 1706 secured by an adhesive layer 1704. The assembly 1700 also includes at least one channel 1710 formed in at least one of the substrates 1702, 1706. The channel 1710 is configured to vent the adhesive layer 1704, securing the two substrates 1702, 1706, to an exterior 1750 of the assembly 1700. At least one side of the channel 1710 bounds the adhesive layer 1704. The channel 1710 provides a path for volatiles outgassing from the adhesive layer 1704 to escape from between the substrates 1702, 1706. The assembly 1700 may be a system or component as described above with reference to the assembly 1500.

The adhesive layer 1704 may be fabricated and configured as described above with reference to FIGS. 3-16, and may optionally include venting channels (i.e., channels 310, 510, 610, 710, 810, 910, 1010, 1210, 1310, 1510 not shown in FIG. 17) formed in the adhesive layer 1704. The one or more channels 1710 formed in at least one of the substrates

1702, 1706 is bounded on at least one side by the adhesive layer 1704 and has at least one outlet 1712 on the exterior 1750 of the assembly 1700 to facilitate outgassing of the adhesive layer 1704. Additionally, the channels 1710 may be used to introduce a bond weakening agent to an interior region 1714 of the adhesive layer 1704 for separating the bonded substrates 1702, 1706.

Figure 18:
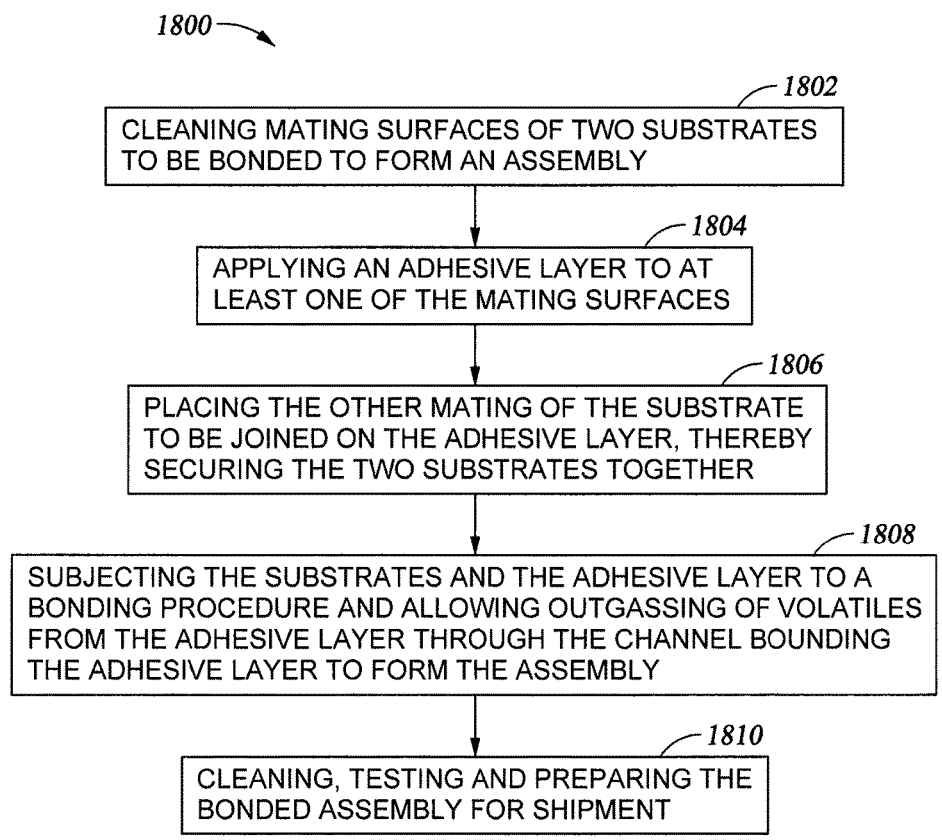
FIG. 18 is a flow diagram of one embodiment of a method for fabricating an assembly comprising at least two substrates secured by an adhesive layer.

FIG. 18 is a block diagram of a method 1800 for fabricating an assembly. The assembly may include at least two substrates secured by an adhesive layer, such as described above with reference to FIGS. 3-17. The method 1800 generally includes applying an adhesive layer onto a first substrate. Placing a second substrate onto the adhesive layer for attaching the two substrates together. The adhesive layer has at least one side of a channel that extends laterally between the substrates to an exterior of the assembly. Subjecting the substrates and the adhesive layer to a bonding procedure, and outgassing volatiles from the adhesive layer between the substrates through the channel.

In one embodiment, the method 1800 begins at step 1802 by cleaning the mating surfaces of two substrates which are to be assembled to form an assembly, such as a chamber component. Cleaning may be accomplished by wiping the mating surfaces with solvent, deionized water or other suitable cleaner. The mating surfaces of two substrates may optionally be roughened.

At step 1804, an adhesive layer is applied to at least one of the mating surfaces. The adhesive layer may be in the form of a preformed adhesive sheet (which can be laid down) or a fluid (e.g., paste that can be dispensed, screen printed, masked or otherwise applied in a desired pattern). In one embodiment, the adhesive layer comprises a plurality of precut shapes that are secured to at least one of the mating surfaces of the substrate. The adhesive layer may be squeegeed to substantially remove air bubbles and to ensure the adhesive layer is substantially flat against the mating surface. The adhesive layer is applied to at least one of the mating surfaces in a manner that defines a side of one or more channels that open to an exterior of the chamber component. The channels are configured to allow volatiles outgassing from the adhesive layer to escape from between the substrates and/or to allow introduction of a bond weakening agent into an interior region of the adhesive layer during debonding should it be desirable to later separate the substrates.

At step 1806, any release liner disposed on the adhesive layer is removed and the other substrate is precisely aligned and placed on the adhesive layer, thereby securing the two substrates together.

At step 1808, the substrates and the adhesive layer are subjected to a bonding procedure suitable for the type of adhesive being utilized. For an exemplary acrylic-based adhesive layer used in the assembly, the bonding procedure may include baking in an autoclave for a predefined period of time. The bonding procedure may be performed under vacuum to enhance outgassing of volatiles from the adhesive layer. The channels bounding the adhesive layer allows for faster and more thorough curing of the adhesive material comprising the adhesive layer, along with allowing any volatiles outgassed from the adhesive layer to escape from between the substrates.

At step 1810, the bonded assembly is cleaned, tested and prepared for shipment.

Figure 19:
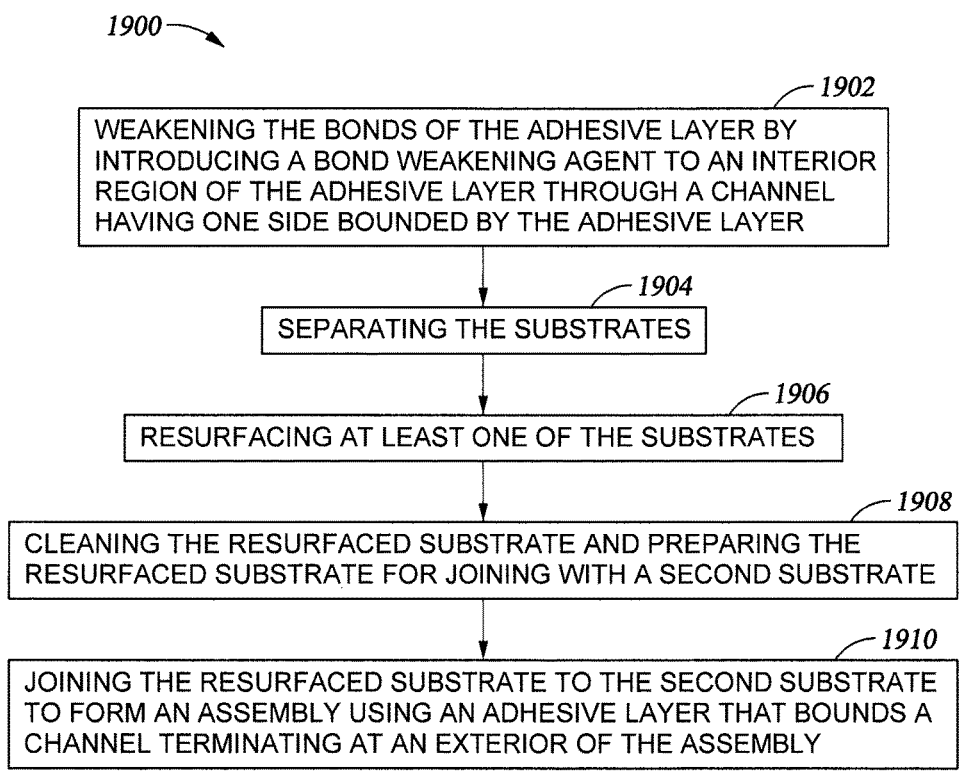
FIG. 19 is a flow diagram of one embodiment of a method for refurbishing an assembly comprising at least two substrates secured by an adhesive layer.

FIG. 19 is a block diagram of a method 1900 for refurbishing an assembly. The assembly, such as an assembly described above with reference to FIGS. 3-17, may include at least two substrates secured by an adhesive layer. At least one side of the adhesive layer bounds a channel that laterally extends between the substrates to an exterior of the assembly. The method 1900 generally includes introducing a bond weakening agent to an interior region of the adhesive layer through the channel, separating the substrates, refurbishing the first substrate, and forming a refurbished assembly using the refurbished first substrate.

At step 1902, a bond formed by the adhesive layer is weakened by introducing a bond weakening agent to an interior region of the adhesive layer via a channel having at least one side bounded by the adhesive layer. The channel extends from an exterior of the assembly into the interior region of the adhesive layer. The bond weakening agent may be a solvent or other material suitable for weakening the bonds of a particular adhesive material comprising the adhesive layer. Introduction of the bond weakening agent to the interior region of the adhesive layer may be accomplished by the bond weakening agent flowing through the channel to the interior region. Since the channel has at least one side bounded by the adhesive layer, the bond weakening agent is in contact across a large region of the adhesive layer. Additionally, the substrates may be heated to enhance the chemical attack of the adhesive layer by the bond weakening agent.

At step 1904, the substrates are separated. Separating the substrates may optionally include prying the substrates apart.

At step 1906, at least one of the substrates is resurfaced. For example, a surface pitted by exposure to a plasma environment may have a portion of the surface removed to leave a substantially non-pitted surface. The portion of the surface may be removed by machining, grinding, bead blasting, abrasive blasting, chemical mechanical polishing, lapping or other suitable technique.

In the case that the substrate being resurfaced is a ceramic electrostatic puck, a new layer of ceramic material may be disposed on the surface after resurfacing. The new layer of ceramic material may be spray deposited or otherwise bonded to the substrate. The new layer of ceramic material deposited on the substrate is then worked to add surface features, such as mesas, surface gas distribution channels and the like.

In the case that the substrate being resurfaced is a gas distribution plate, resurfacing substantially restores the surface exposed to the plasma environment to a surface roughness equal to that of a new gas distribution plate. Restoration of the surface may include material removal and polishing processes. For example, the surface may be polished to a surface roughness of about 20 Ra or less.

In other embodiments, one substrate may be replaced with a new or different substrate instead of resurfacing one of the separated substrates.

At step 1908, the resurfaced (or replacement) substrate is cleaned and prepared for joining with a second substrate. The second substrate may be a reclaimed substrate, such as the substrate from which the resurfaced substrate was previously bonded to at step 1902, or a new substrate. Cleaning the mating surfaces of two substrates may be accomplished by wiping the mating surfaces with solvent, deionized water or other suitable cleaner. The mating surfaces of two substrates may optionally be roughened prior to joining.

At step 1910, the resurfaced substrate joined to a second substrate by an adhesive layer. The substrate joining technique may be the method 1800 described above or other suitable joining technique.

In summation, a method for bonding substrates and assemblies fabricated by the same, along with improved methods for refurbishing said assemblies have been disclosed. The assemblies take advantage of an adhesive layer with at least one channel bounded by the adhesive utilized to join the two substrates. The channel in the adhesive improves fabrication, performance and refurbishment of the assemblies. The channel provides a vent path for volatile gases to outgas from the adhesive layer and escape from between the substrates, either during curing or use of the assembly. Advantageously, the vent path enhances better curing of the adhesive layer, improves the temperature profile control, allows stress management within the assembly for enhanced flatness control, and allows for more efficient and less destructive debonding/separating of the substrates. The invention described herein is particularly useful for semiconductor vacuum processing chamber components (i.e., assemblies), such as electrostatic chuck assemblies and showerhead assemblies among others. However, the invention is also useful for other applications wherein the ability to vent an adhesive layer securing two or more substrates is desirable.

While the foregoing is directed to embodiments of the present invention, other and further embodiments of the invention may be devised without departing from the basic scope thereof, and the scope thereof is determined by the claims that follow.

What is claimed is:

1. A method of fabricating an assembly, comprising:
applying an adhesive layer onto a first substrate;
placing a second substrate onto the adhesive layer, thereby securing the two substrates together, the adhesive layer bounding at least one side of a channel that extends laterally between the substrates to an exterior of the assembly; and
subjecting the substrates and the adhesive layer to a bonding procedure and allowing outgassing of volatiles from the adhesive layer to escape from between the substrates through the channel, wherein the substrates bonded by the adhesive layer form a component for a semiconductor vacuum processing chamber.

2. The method of claim 1, wherein the adhesive layer has a plurality of segments.

3. The method of claim 2, further comprising:
fabricating at least two of the plurality of segments from different adhesive materials.

4. The method of claim 3, wherein a first segment of the plurality of segments is formed from a first adhesive material having a coefficient of thermal conductivity different than a second adhesive material comprising a second segment.

5. The method of claim 3, wherein, wherein a first segment comprised of the plurality of segments has an adhesive material strength different than a second segment.

6. The method of claim 1, wherein the adhesive layer has a thermal conductivity greater than about 0.3 W/mK.

7. The method of claim 1, wherein the first substrate is an electrostatic puck or gas distribution plate.

8. A method of refurbishing an assembly having two substrates joined together by an adhesive layer, wherein at least one side of the adhesive layer bounds a channel that laterally extends between the substrates to an exterior of the assembly, the method comprising:
introducing a bond weakening agent to an interior region of the adhesive layer through the channel;
separating the substrates;
refurbishing the first substrate; and
forming a refurbished assembly using the refurbished first substrate.

9. The method of claim 8, wherein forming the refurbished assembly further comprises joining the refurbished first substrate to one of a refurbished second substrate or a new second substrate.

10. The method of claim 8, further comprising:
circumscribing the adhesive layer with a seal ring.

11. The method of claim 8, wherein the adhesive layer has a thermal conductivity greater than about 0.3 W/mK.

12. The method of claim 8, wherein forming the refurbished assembly further comprises allowing a new adhesive layer joining the refurbished first substrate to one of a refurbished second substrate or a new second substrate to vent though the channel having one side bounded by the adhesive layer and extending between the substrates to an exterior of the refurbished assembly.

13. The method of claim 12, further comprising:
forming a plurality of segments in the adhesive layer with a channel defined therein the adhesive layer.

14. The method of claim 13, wherein forming the plurality of segments comprises:
forming a first segment with a first adhesive material having a coefficient of thermal conductivity different than a second adhesive material comprising a second segment.

15. The method of claim 13, wherein forming the plurality of segments comprises:
forming a first segment with a first adhesive material having a strength different than a second adhesive material comprising a second segment.

16. The method of claim 13, wherein forming the plurality of segments comprises:
fabricating at least two segments of the plurality of segments from different adhesive materials.

17. The method of claim 8, further comprising:
forming the adhesive layer from one or more of acrylic-based adhesives, neoprene-based adhesives, silicone adhesives, epoxies, PSA (Pressure Sensitive Adhesives), thermoplastic adhesives, and thermoset adhesives.

18. The method of claim 8, wherein the adhesive layer has a lap shear adhesion of at least 40 pounds per square inch (PSI) and a tensile strength of 40 PSI at 25 degrees Celsius.

* * * * *